(12) United States Patent
Takatsuka et al.

(10) Patent No.: US 6,956,758 B2
(45) Date of Patent: Oct. 18, 2005

(54) FULLY-HIDDEN REFRESH DYNAMIC RANDOM ACCESS MEMORY

(75) Inventors: Takafumi Takatsuka, Hyogo (JP); Hirotoshi Sato, Hyogo (JP); Masaki Tsukude, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/049,463

(22) Filed: Feb. 3, 2005

(65) Prior Publication Data

US 2005/0141337 A1 Jun. 30, 2005

Related U.S. Application Data

(62) Division of application No. 10/352,218, filed on Jan. 28, 2003, now Pat. No. 6,859,415.

(30) Foreign Application Priority Data

Mar. 29, 2002 (JP) .............................. 2002-094477

(51) Int. Cl.[7] .................................................. G11C 8/00
(52) U.S. Cl. .................... 365/133.5; 365/222; 365/194
(58) Field of Search ............................ 365/233.5, 222, 365/194

(56) References Cited

U.S. PATENT DOCUMENTS

| 5,113,500 | A | 5/1992 | Talbott et al. |
| 5,469,473 | A | 11/1995 | McClear et al. |
| 6,173,425 | B1 | 1/2001 | Knaack et al. |
| 6,388,934 | B1 | 5/2002 | Tobita |
| 6,545,943 | B2 | 4/2003 | Mizugaki et al. |
| 6,625,079 | B2 | 9/2003 | Yahata et al. |
| 6,721,223 | B2 * | 4/2004 | Matsumoto et al. ........ 365/222 |
| 6,741,515 | B2 * | 5/2004 | Lazar et al. ................ 365/222 |
| 6,801,468 | B1 * | 10/2004 | Lee ........................ 365/233.5 |

| 2002/0178323 | A1 | 11/2002 | Tsukude et al. |
| 2003/0112688 | A1 | 6/2003 | Nakashima et al. |
| 2003/0198090 | A1 | 10/2003 | Takatsuka et al. |
| 2003/0231540 | A1 | 12/2003 | Lazar et al. |

FOREIGN PATENT DOCUMENTS

| JP | 363114000 A | 5/1988 |
| JP | 03-108185 | 5/1991 |
| JP | 403144992 A | 6/1991 |
| JP | 406301631 A | 10/1994 |
| JP | 4080007562 A | 1/1998 |

OTHER PUBLICATIONS

"A 30-uA Data-Retention Pseudostatic RAM with Virtually Static RAM Mode", K. Sawada et al., IEEE Journal of Solid-State Circuits, vol. 23, No. 1, Feb. 1988, pp. 12-19.

* cited by examiner

*Primary Examiner*—Son T. Dinh
*Assistant Examiner*—Tuan T. Nguyen
(74) *Attorney, Agent, or Firm*—McDermott Will & Emery LLP

(57) ABSTRACT

A composite gate detects whether an internal array is in a selected state and an internal row activation signal is activated in accordance with a timing relationship between an output signal of the composite gate and an address transition detection signal. When the address transition detection signal is applied, the internal row activation signal is deactivated in accordance with generation timings of delayed restore period signal indicating whether the internal array is in a selected state and of the address transition detection signal to permit the next row access. With such a configuration, the next operation is allowed to start after an internal state is surely restored to an initial state. When the next address transition detection signal is applied during a period of a restoration operation, a column recovery operation, or a refreshing operation, data access is correctly performed without causing data destruction.

7 Claims, 28 Drawing Sheets

FULLY-HIDDEN REFRESH DYNAMIC RANDOM ACCESS MEMORY

RELATED APPLICATION

This application is a divisional of application Ser. No. 10/352,218 filed Jan. 28, 2003, now U.S. Pat. No. 6,859,415.

BACKGROUND OF THE INVENTION

1. Field of the Invention

The present invention relates to a semiconductor memory device, and particularly to a fully-hidden refresh DRAM (Dynamic Random Access Memory) capable of fully hiding an internally performed refreshing operation from an outside. More particularly, the present invention relates to a dynamic semiconductor memory device having an interface fully compatible with an SRAM (Static Random Access Memory).

2. Description of the Background Art

A DRAM (Dynamic Random Access Memory) is in general constructed from memory cells each constituted of one transistor and one capacitor. Therefore, an occupation area of the memory cell is small and DRAM is suited for implementation of a large capacity memory device. The DRAM, however, stores information in a capacitor in the form of electric charges and electric charges accumulated in the capacitor leak out over time to cause destruction of data. Therefore, in order to prevent the destruction of data due to leakage of the electric charges, it is required to perform a refreshing operation of re-writing storage data periodically. In a normal operation mode of performing a data access, an external memory controller controls timings for executing the refreshing.

An SRAM (Static Random Access Memory) is constructed from memory cells each constituted of 4 transistors and 2 load elements and an occupation area of a memory cell is larger as compared with a DRAM cell. An SRAM cell is constructed basically from a flip-flop and stores data as far as power is supplied, and therefore, no requirement arises for refreshing in SRAM. Thus, in general, SRAM is used as a main memory in portable equipment because of controllability.

In the field of portable equipment as well, it is increasingly required to handle a great volume of data such as image data due to improvement in functionality, and accordingly the main memory device is required to have an adequately large storage capacity. If such a large capacity memory device is constructed using an SRAM, an occupation area of the memory would be increased, to be a great obstacle against down-sizing of the entire system.

Thus, a hidden refresh DRAM requiring no external refresh control has been proposed for a main memory device of a large storage capacity as substitution for the SRAM. In such a hidden refresh DRAM, a refresh request is repeatedly issued internally at prescribed intervals to perform refreshing operations internally in accordance with the refresh requests. When external data access conflicts with an internal refresh request, the external data access or the internal refresh request, whichever is designated at a faster timing, is performed by an arbitration circuit. For example, in a case where a refresh request is supplied faster in timing than data access (data writing or data reading), a refreshing operation is first performed, and after completion of the refreshing operation, a data access operation is performed in accordance with the external data access.

In such a fully-hidden refresh DRAM is called a VSRAM (Virtually Static RAM). An example of such a memory is disclosed in, for example, "A 30 μA Data-Retention Pseudo-static RAM with Virtually Static RAM Mode" by SAWADA et. al. IEEE Journal of Solid State Circuits, Vol. 23, No. 1, pp. 12 to 17.

In a fully hidden refresh DRAM which does not require an external refreshing control to completely hide a refreshing operation from outside, refresh requests are issued using a built-in timer circuit and refresh is performed in accordance with a refresh address generated internally in accordance with the refresh request. The refresh timer operates asynchronously with external data access, and a necessity arises for arbitration between a refresh request and a data access instruction since data destruction occurs when an external data access and a refresh request conflict with each other.

As an arbitration circuit, in the above prior art reference, a flip-flop is employed that receives a normal access request responsive to a chip enable signal /CE and a refresh request generated internally, and it is determined which of the requests is activated earlier. In this prior art, the determination circuit is constructed of a NAND type flip-flop. Therefore, when a refresh request and a data access request conflict with each other, in order to consecutively perform refreshing operation and data access operation, the following condition is imposed: even if a signal instructing one request enters an inactive state, the other signal instructing the other request is required to be maintained in active state. For this reason, an activation period of a refresh request is made longer than a period for which a refreshing operation is performed internally, and an activation period of a data access request signal is also required to be made longer than a period for which the refreshing operation is performed and completed. Hence, in an external data access, for example a command instructing a data access request cannot be applied in a one-shot pulse form in synchronization with a dock signal.

Furthermore, in this prior art, if a data access request is issued when an internal state transitions to a precharging operation state after a refreshing operation is completed in accordance with a refresh request, the external data access request is accepted to start an internal operation starts. Therefore, there is a possibility that the data access operation is started before an internal circuit does not restore completely to a prescribed initial state, and correct data access operation could not ensured.

If a refresh request is issued when a normal data access request is deactivated and a precharge operation is being internally performed, a similar problem arises.

In the above prior art reference, a data access request is activated in accordance with chip enable signal /CE. Therefore, such a prior art technique has a problem that it can not be applied to an interface utilizing an address transition detection signal generally widely adopted as an interface of the SRAM. That is, in the above document, the chip enable signal is required to be toggled depending on data access and it is impossible to change an address signal with chip enable signal /SE fixed at L level, to define a memory cycle in accordance with the transition of the address signal. Therefore, the prior art technique could not accommodate for an interface of an address transition detection type, thereby disabling implementation of a DRAM having complete compatibility with an SRAM.

In a case where data accesses are consecutively performed, according to the configuration of the above prior art document, the data accesses are consecutively accepted. In this prior art document, a word line is driven to an inactive state automatically when a prescribed time elapses after the word line is selected and driven into an active state. In a case where the next data access instruction is supplied before the prescribed time elapses, the next data access operation is performed prior to restoration of internal circuitry to a precharged state, data collision may occur to cause a problem of correct data access being not ensured.

SUMMARY OF THE INVENTION

It is an object of the present invention to provide a fully hidden refresh DRAM capable of performing a correct data access regardless of a timing of application of an external data access instruction with respect to an internal operating state.

It is another object of the present invention to provide a fully hidden refresh DRAM having an interface completely compatible with an SRAM interface.

A semiconductor memory device according to a first aspect of the present invention includes: a plurality of memory cells; an internal operation control circuit for generating an activation signal indicating activation of a selection operation on a memory cell; and an arbitration control circuit responsive to the activation signal and a memory cell selection instruction for delaying an operation according to the memory cell selection instruction till deactivation of the activation signal when the memory cell selection instruction is applied while the activation signal is in an active state.

A semiconductor memory device according to a second aspect of the present invention includes: a plurality of memory cells; an address transition detection circuit for detecting a transition in address signal applied externally to generate an address transition detection signal having a prescribed time width when detecting the transition of the address signal; and an internal control circuit for initializing an internal operation in response to activation of the address transition detection signal and activating a memory cell selection operation to perform a select operation on a memory cell in accordance with the address signal applied externally.

When a memory cell selection instruction is applied while an activation signal indicating an activation period of a memory cell select operation is activated, the next operation can be performed after an internal circuit is reliably restored to an initial state, thereby enabling prevention of destruction of data.

In a case where the activation signal is activated when a refreshing operation is performed, a data access can be performed after the refreshing operation is completed and the internal circuit restores to an initial state. Thus, data access can be made while reliably preventing the conflict between refreshing and data access.

Furthermore, by detecting a transition of an address signal for use as a timing signal determining a start/end timing of a memory cycle, it is possible to achieve a DRAM having an interface fully compatible with an SRAM interface.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
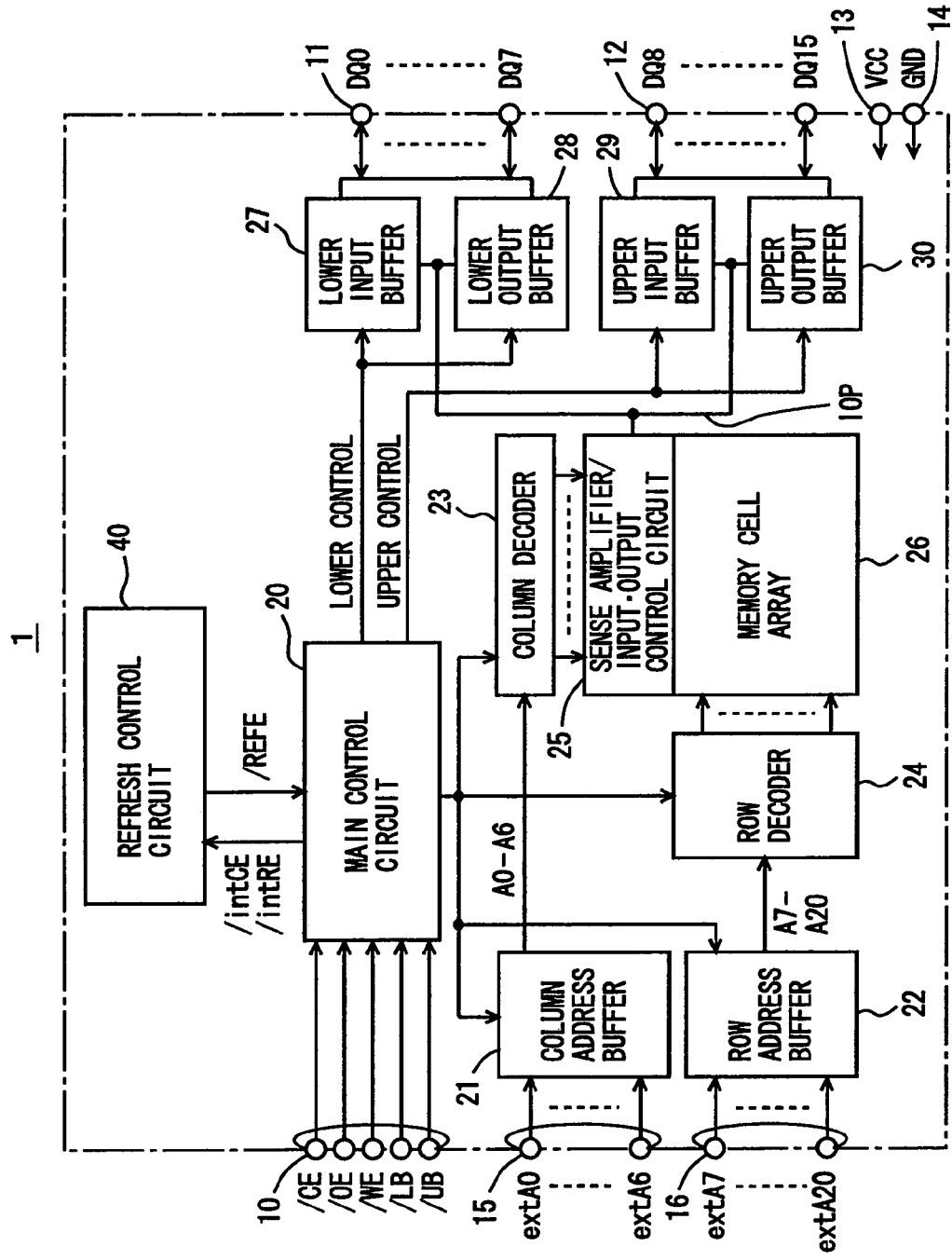
FIG. 1 is a diagram schematically showing an overall configuration of a semiconductor memory device according to a first embodiment of the present invention.

FIG. 1 is a diagram schematically showing an overall configuration of a semiconductor memory device according to a first embodiment of the present invention. In FIG. 1, a semiconductor memory device 1 includes: a main control circuit 20 receiving chip enable signal /CE, an output enable signal /OE, a write enable signal /WE, a lower byte enable signal /LB and an upper byte enable signal /UB applied through a control input terminal group 10, to generate signals for controlling various kinds of internal operations.

Chip enable signal /CE indicates that semiconductor memory device 1 is selected and set in a state allowing data access. Output enable signal /OE instructs data outputting. Write enable signal /WE instructs data writing.

Semiconductor memory device 1 inputs and outputs 16 bit data DQ0 to DQ15 as one example. Lower byte enable signal /LB indicates that lower byte data DQ0 to DQ7 is valid. Upper byte enable signal /UB indicates that upper byte data DQ8 to DQ15 is valid.

Semiconductor memory device 1 further includes: a column address buffer 21 receiving address bits A0 to A6 applied through an address input terminal group 15 under control of main control circuit 20, to generate internal column address signal bits A0 to A6; and a row address buffer 22 buffering external address signal bits extA7 to extA20 applied through a row address input terminal group 16, to generate internal row address signal bits A7 to A20. External address signal bits extA0 to extA20 are simultaneously applied and similar to a standard SRAM, incorporated by column address buffer 21 and row address buffer 22 when output enable signal /OE or write enable signal /WE is activated under activation of chip enable signal /CE, and internal column address signal bits A0 to A6 and internal row address signal bits A7 to A20 are generated.

Semiconductor memory device 1 further includes: a memory cell array 26 having a plurality of memory cells arranged in rows and columns; a row decoder 24 for decoding internal row address signal bits A7 to A20 from row address buffer 22 to drive an addressed row in memory cell array 26 into selected state; a column decoder 23 for decoding internal column address bits A0 to A6 from column address buffer 21 to generate a column select signal for selecting an addressed column in memory cell array 26; sense amplifiers sensing, amplifying and latching data in memory cells on selected row in memory cell array 26; and an input/output control circuit for coupling an addressed column in memory cell array 26 to an internal data bus IOP in accordance with a column select signal from column decoder 23. In FIG. 1, the sense amplifiers and the input/output control circuit (column select circuit) are indicated by a block 25.

Semiconductor memory device 1 further includes: a lower input buffer 27 and a lower output buffer 28 provided to a lower byte data terminal group 11; and an upper input buffer 29 and an upper output buffer 30 provided to an upper byte data terminal group 12. Lower input buffer 27, when activated, buffers data bits DQ0 to DQ7 applied to lower byte data terminal group 11, to generate internal write data for transmission to internal data bus IOP.

Lower input buffer 27, when activated, buffers lower byte data bits DQ0 to DQ7 applied to lower byte data terminal group 11, to generate internal write lower data bits for transmission to internal data bus IOP. Lower output buffer 28, when activated, generates external lower byte data bits DQ0 to DQ7 from data transmitted onto internal data bus IOP, for transmission to lower byte data terminal group 11.

Upper input buffer 29, when activated, buffers upper byte data bits DQ8 to DQ15 applied to upper byte data terminal group 12 to generate internal write upper data bits for transmission to internal data bus IOP. Upper output buffer 30, when activated, buffers internal upper byte data transmitted onto internal data bus IOP to generate upper data bits DQ8 to DQ15.

Semiconductor memory device 1 further includes: a refresh control circuit 40 receiving internal chip enable signal /intCE and an internal normal row activation signal /intRE from main control circuit 20 to generate a refresh activation signal /REFE for application to main control circuit 20 when refreshing operation can be performed. Internal normal row activation signal /intRE is maintained in an active state while memory cell array 26 is internally kept in a selected state, that is, memory cell array 26 is in a selected state (including a recovery period for restoring to an initial state). Internal normal row activation signal /RE determines a period of one memory cycle.

When refresh activation signal /REFE is activated, main control circuit 20 executes a refreshing operation on memory cells in memory cell array 26. In FIG. 1, for simplification of the drawing, there are not shown a circuit for generating a refresh address for refreshing and a multiplexer for switching between an internal row address from row address buffer circuit 22 and the refresh address.

Refresh control circuit 40 includes a timer and outputs refresh requests at prescribed intervals in accordance with a time measuring operation of the timer. Therefore, the refresh request is issued asynchronously with a data access instruction. In refresh control circuit 40, by generating refresh activation signal /REFE in accordance with a refresh request, internal chip enable signal /intCE and internal normal row activation signal /intRE, conflict between a refreshing operation and a normal data access is prevented from arising.

Main control circuit 20 further performs control of delaying a normal data access till a refresh is completed if a data access instruction is applied under an active state of refresh activation signal /REFE (when chip enable signal /CE is at L level, and output enable signal /OE or write enable signal /WE is at L level).

Figure 2:
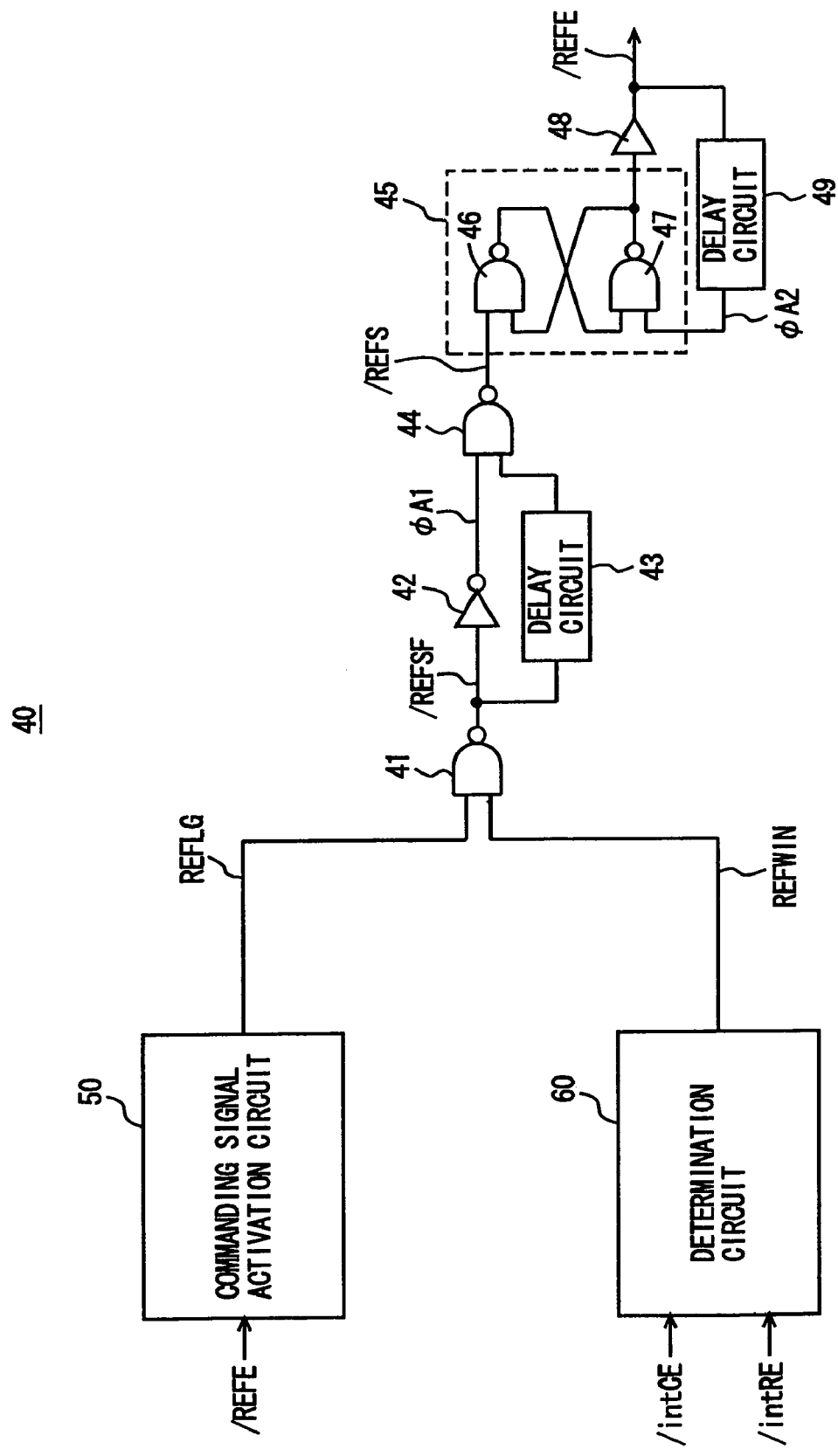
FIG. 2 is a diagram showing a configuration of a refresh control circuit shown in FIG. 1.

FIG. 2 is a diagram showing a configuration of refresh control circuit 40 shown in FIG. 1. In FIG. 2, refresh control circuit 40 includes: a commanding signal activation circuit 50 for generating a refresh flag REFLG indicating that a refresh request is issued; a determination circuit 60 receiving internal chip enable signal /int/CE and internal normal row activation signal /intRE to generate a refresh window signal REFWIN setting a refresh determination period in which determination is made on whether refreshing is executable; and a refresh activation circuit for generating refresh activation signal /REFE in accordance with refresh flag REFLG from commanding signal activation circuit 50 and refresh window signal REFWIN.

Refresh activation circuit includes: a NAND circuit 41 receiving refresh flag REFLG and refresh window signal REFWIN; an inverter 42 inverting an output signal of NAND circuit 41; a delay circuit 43 delaying an output signal /REFSF of NAND circuit 41 by a prescribed time; a NAND circuit 44 receiving an output signal φA1 of inverter 42 and an output signal of delay circuit 43 to generate a signal /REFS; a set/reset flip-lop 45 set in response to activation of output signal /REFF of NAND circuit 44; a buffer circuit 48 for buffering an output signal of set/reset flip-flop 45, to generate refresh activation signal /REFE; and a delay circuit 49 for delaying refresh activation signal /REFE outputted by buffer circuit 48 by a prescribed time, to generate a reset signal φA2 resetting set/reset flip-flop 45.

Inverter 42, delay circuit 43 and NAND circuit 44, in combination, construct a one-shot pulse generation circuit for generating a one-shot pulse signal in response to a falling of output signal /REFSF of NAND circuit 41.

Refresh flag REFLG is set when a refresh request is issued in a prescribed cycle in commanding signal activation circuit 50, and reset when a refreshing operation is completed. Therefore, when refresh flag REFLG is set, it is indicated that refresh is to be executed.

Figure 3:
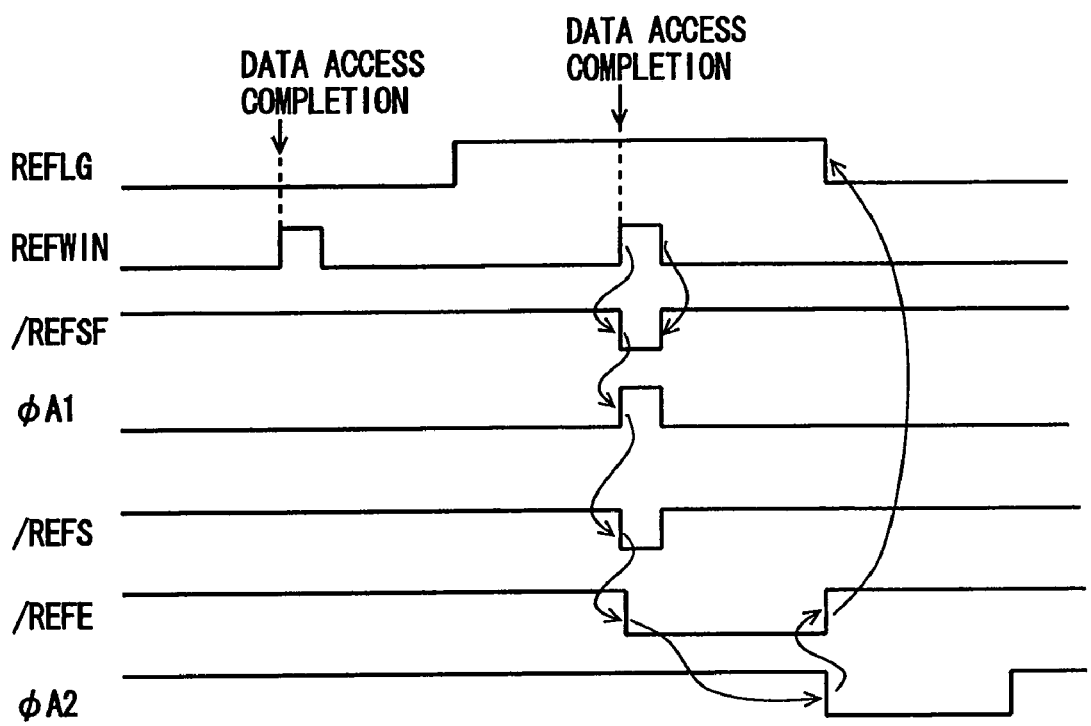
FIG. 3 is a waveform diagram representing an operation of the refresh control circuit shown in FIG. 2.

FIG. 3 is a diagram schematically representing an operation of the refresh control circuit shown in FIG. 2. In FIG. 3, no consideration is given on a state of internal normal row activation signal /intRE. If internal normal row activation signal /intRE is deactivated when data access is completed internally, determination circuit 60 drives refresh window signal REFWIN to H level for a prescribed time to set a period for which it is determined whether refresh is executable following the internal data access.

Upon completion of data access, refresh window signal REFWIN from determination circuit 60 becomes H level for a prescribed period. At this time, if refresh flag REFLG from commanding signal activating circuit 50 is at L level, output signal /REFSF from NAND circuit 41 maintains the H level, and refresh activation signal /REFE also maintains the H level since a state of set/reset flip-flop 45 dose not change. Therefore, in this case, no refresh is performed.

Subsequently, when a refresh request is issued inside commanding signal activating circuit 50, refresh flag REFLG rises to H level. On completion of data access, refresh window signal REFWIN from determination circuit 60 rises to H level. If refresh flag REFLG is at H level, output signal /REFSF of NAND circuit 41 falls to L level and in response, output signal φA1 of inverter 42 rises to H level. Since an output signal of delay circuit 43 is at H level at this time, output signal /REFS of NAND circuit 44 falls to L level, set/reset flip-flop 45 is set and refresh activation signal /REFE rises to H level. Refresh is performed internally in a period during activation of refresh activation signal /REFE. When a delay time of delay circuit 49 elapses, output signal. φA2 of delay circuit 49 falls to L level, in response, set/reset flip-flop 45 is reset and refresh activation signal /REFE is deactivated to complete refreshing. On completion of the refresh, refresh flag REFLG is deactivated in commanding signal activating circuit 50 in response to the deactivation of refresh activation signal REFE and it is indicated that no refresh in standby state exists.

Therefore, if data access is internally executed, refresh window signal REFWIN is activated on completion of data access and a state of refresh flag REFLG is checked. By performing refreshing in accordance with a result of determination, conflict between refresh and data access can be prevented from occurring since even if a refresh request is issued in execution of data access, refreshing is caused to wait for completion of data access.

Figure 4:
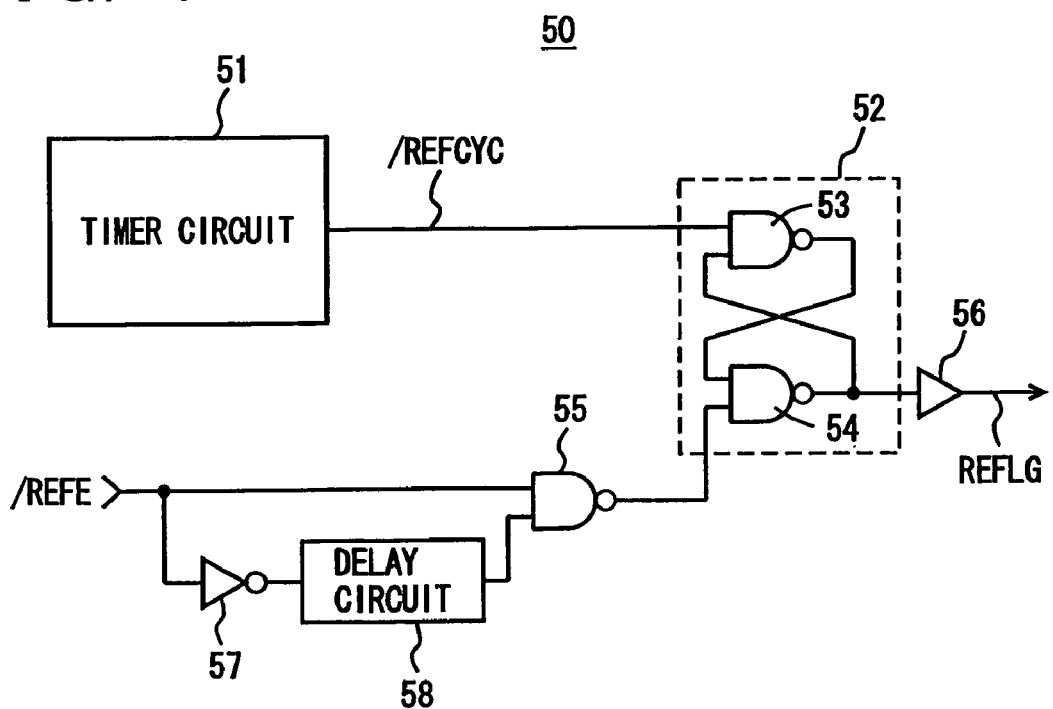
FIG. 4 is a diagram showing an example of the configuration of a commanding signal activating circuit shown in FIG. 2.

FIG. 4 is a diagram showing an example configuration of commanding signal activating circuit 50 shown in FIG. 2. In FIG. 4, commanding signal activating circuit 50 includes: a timer circuit 51 for generating a refresh cycle signal (refresh requests) /REFCYC in a prescribed period; an inverter 57 inverting refresh activation signal /REFE; a delay circuit 58 delaying an output signal of inverter 57 by a prescribed period; a NAND circuit 55 receiving an output signal of delay circuit 58 and refresh activation signal /REFE; a flip-flop 52 set in response to activation (a falling edge) of refresh cycle signal /RECYC and reset in response to activation (a falling edge) of an output signal of NAND circuit 55; and an inverter 56 inverting an output signal of flip-flop 52 to generate refresh flag REFLG.

Inverter 57, delay circuit 58 and NAND circuit 55, in combination, constitute a rising one-shot pulse generation circuit and generates a one-shot pulse signal having a time width of a delay time that delay circuit 58 has in response to deactivation (rising) of refresh activation signal /REFE.

Timer circuit 51 is constructed of, for example, a ring oscillator and a counter circuit counting an oscillation signal of the ring oscillator, and each time a count value reaches a prescribed value, refresh cycle signal /REFCYC is activated.

Set/reset flip-flop 52 is set when refresh cycle signal /REFCYC is activated to set refresh flag REFLG, and resets refresh flag REFLG when refresh activation signal /REFE is deactivated. By determining whether refresh is executable on the basis of refresh window signal REFWIN from determination circuit 60 shown in FIG. 2 while using refresh flag REFLG, there can be achieved a first measure for preventing conflict between refresh and data access.

Figure 5:
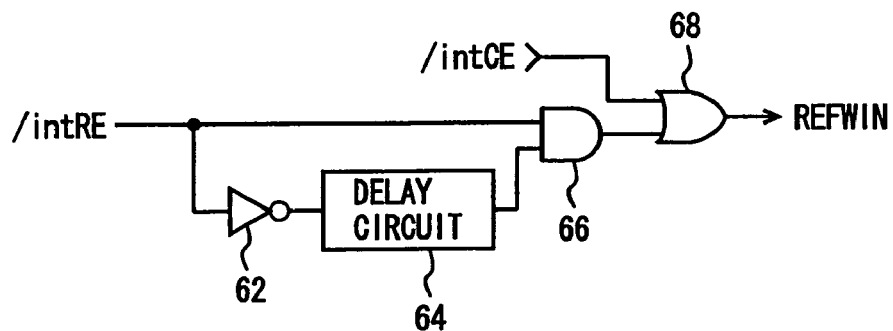
FIG. 5 is a diagram showing an example of the configuration of a determination circuit shown in FIG. 2.

FIG. 5 is a diagram showing an example of the configuration of determination circuit 60 shown in FIG. 2. In FIG. 5, determination circuit 60 includes: an inverter 62 receiving internal normal row activation signal /intRE; a delay circuit 64 delaying an output signal of inverter 62; an AND circuit 66 receiving an output signal of delay circuit 64 and internal normal row activation signal /intRE; and an OR circuit 68 receiving an output signal of AND circuit 66 and internal chip enable signal /intCE to generate refresh window signal REFWIN.

Inverter 62, delay circuit 64 and AND circuit 66, in combination, constitute a one-shot pulse generation circuit for generating a one-shot pulse in response to a rising of internal normal row activation signal /intRE. Internal normal row activation signal /intRE is activated when data access is performed, and rises to H level, when an internal memory activation period is completed, to indicate completion of data access. Therefore, when internal normal row activation signal /intRE is in an active state (L level), it is indicated that internally, a memory cell array is in a selected state or the internal circuitry does not restored to the initial state (a precharged state).

If internal chip enable signal /intCE is at L level and the semiconductor memory device is in a selected state, refresh window signal REFWIN is kept at H level for a prescribed period after data access is internally completed to provide a timing for determining whether refresh is to be performed. When internal chip enable signal /intCE is at H level, refresh window signal RFEWIN from OR circuit 68 is at H level. Therefore, the semiconductor memory device is in a non-selected state and when data access is not performed, refreshing is executed in a prescribed cycle in accordance with refresh cycle signal /REFCYC from timer circuit 51 shown in FIG. 4.

Figure 6:
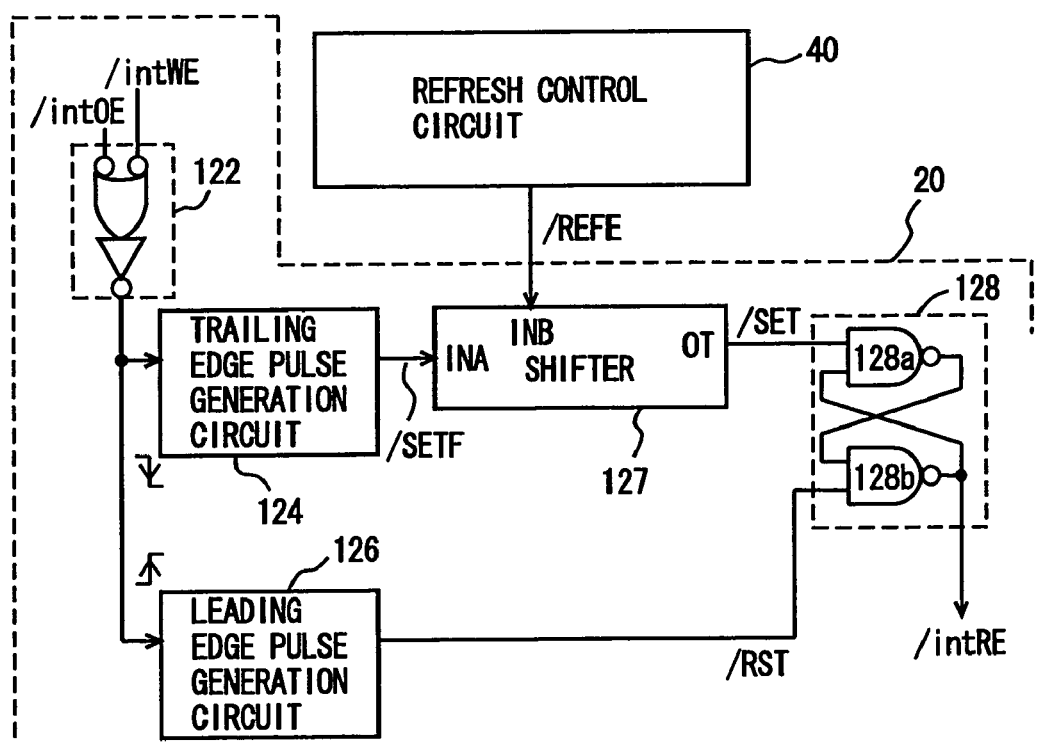
FIG. 6 is a diagram schematically showing a configuration of a main part of a main control circuit according to the first embodiment of the present invention.

FIG. 6 is a diagram schematically showing a configuration of a part for generating internal normal row activation signal included in main control circuit 20 shown in FIG. 1. In FIG. 6, main control circuit 20 includes: a composite AND gate 122 receiving internal write enable signal /intWE and internal output enable signal /intOE; a trailing edge pulse generation circuit 124 for generating a one-shot pulse in response to a trailing edge (a falling edge) of an output signal of composite AND gate 122; a leading edge pulse generation circuit 126 for generating a one-shot pulse signal in response to a leading edge (a rising edge) of an output signal of composite gate 122; a shifter 127 receiving an output signal of trailing edge pulse generation circuit 124 and refresh activation signal /REFE from refresh control circuit 40 to avoid conflict between a refreshing operation and a normal data access operation; and a set/reset flip-flop 128 set in accordance with output signal /SET of shifter 127 and reset in accordance with output signal /RST of leading edge pulse generation circuit 126 to generate internal normal row activation signal /intRE. Set/reset flip-flop 28 includes cross-coupled NAND gates 128*a* and 128*b*.

Internal write enable signal /intWE and internal output enable /intOE are generated by buffering write enable signal /WE and output enable signal /OE, applied externally, in a buffer circuit. When one of internal write enable signal /intWE and internal output enable /intOE is set in an active state (L level), data writing or reading is executed. Which of an input buffer and an output buffer is activated is determined by enable signals /intWE and /intOE.

Trailing edge pulse generation circuit 124 generates a one-shot pulse signal in response to a trailing edge (a falling edge) of an output signal of composite AND gate 122. When a pulse of trailing edge pule generation circuit 124 is generated while refresh activation signal /REFE is in an active state, shifter 127 delays the activation of signal /SET from output OT thereof till deactivation of refresh activation signal /REFE. When refresh activation signal /REFE is in an inactive state, shifter 127 generates a signal /SET at output OT thereof in accordance with a pulse signal from trailing edge pulse generation circuit 124 applied to input INA thereof.

When a data access instruction is applied in execution of refresh, the start of a row access operation for internal data access is delayed till completion of the refresh according to the function of shifter 127.

Figure 7:
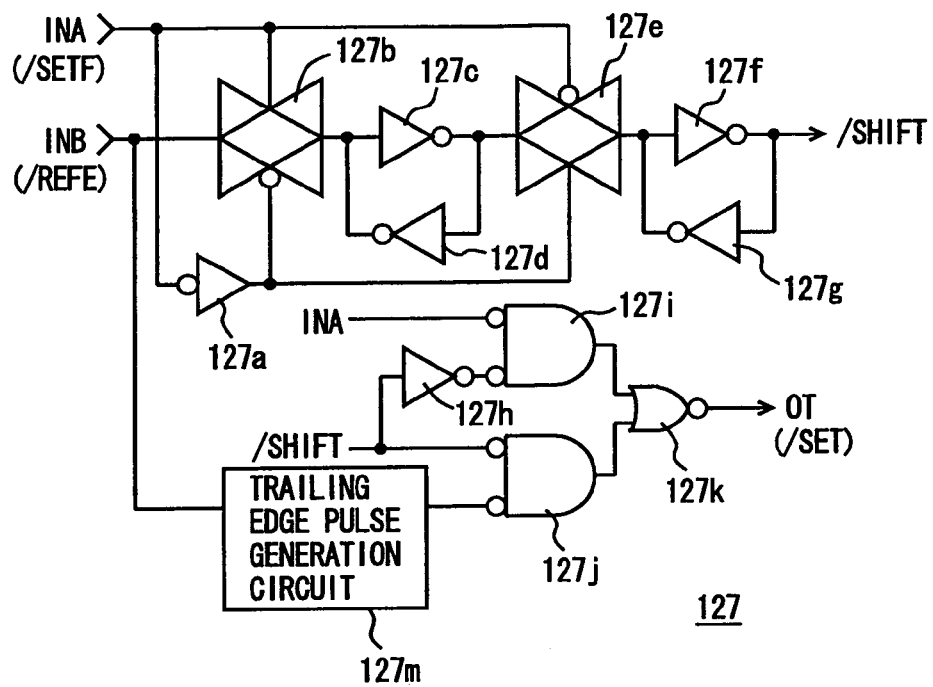
FIG. 7 is a diagram showing an example of the configuration of a shifter shown in FIG. 6.

FIG. 7 is a diagram showing an example of the configuration of a shifter shown in FIG. 6. In FIG. 7, shifter 127 includes: an inverter 127*a* receiving signal (/SETF) applied to input INA; a CMOS transmission gate 127*b* selectively made conductive in accordance with an output signal of inverter 127*a* and to the signal (/SETF) applied to input INA, to transmit signal (/REFE) applied to input INB; an inverter 127*c* inverting a signal applied through CMOS transmission gate 127*b*; an inverter 127*d* connected to inverter 127*c* in anti-parallel fashion, and transmitting an output signal of inverter 127*c* to the input of inverter 127*c*; and a CMOS transmission gate 127*e* selectively rendered conductive in accordance with an output signal of inverter 127*a* and signal (/SETF) applied to input INA.

CMOS transmission gates 127*b* and 127*e* are rendered conductive complementarily to each other and CMOS transmission gate 127*e*, in a conductive state, passes an output signal of inverter 127*c*. CMOS transmission gate 127*b* enters a non-conductive state when a signal applied to input INA falls to L level and CMOS transmission gate 127*e* enters a non-conductive state when a signal applied to input INA rises to H level.

Shifter 127 further includes: an inverter 127*f* inverting a signal from CMOS transmission gate 127*e*; and an inverter 127*g* constituting a latch circuit with inverter 127*f*. Whether output signal /SETF from trailing edge pulse generation circuit 124 is shifted is designated by a signal /SHIFT from inverter 127*f*.

Specifically, determination on whether refresh activation signal /REFE is in a active state is made on a falling (activation) of output signal /SETE of trailing edge pulse generation circuit 124 by CMOS transmission gates 127*b* and 127*e*, and inverters 127*c*, 127*d*, 127*f* and 127*g* to generate shift control signal /SHIFT in accordance with the result of determination.

Shifter 127 further includes: an inverter 127*h* inverting shift control signal /SHIFT; a trailing edge pulse generation circuit 127*m* generating a one-shot pulse signal in response to a trailing edge (a rising edge) of signal (/REFE) applied to input INB; a NOR gate 127*j* receiving shift control signal /SHIFT and an output signal of trailing edge pulse generation circuit 127*m*; a NOR gate 127*i* receiving an output signal of inverter 127*h* and signal (/SEFT) applied to input node INA; and a NOR circuit 127*k* receiving output signals of NOR gates 127*i* and 127*j* to generate signal (/SET) at output node OT.

When shift control signal /SHIFT is at L level, the signal (/SET) is generated at output node OT in accordance with an output signal of trailing edge pulse generation circuit 127*m*. On the other hand, when shift control signal /SHIFT is at H level, the signal (/SET) is generated at output node OT in accordance with a signal applied to input node INA. Internal normal row activation signal /intRE is activated by signal /SET at output node OT to start a data access operation.

Figure 8A:
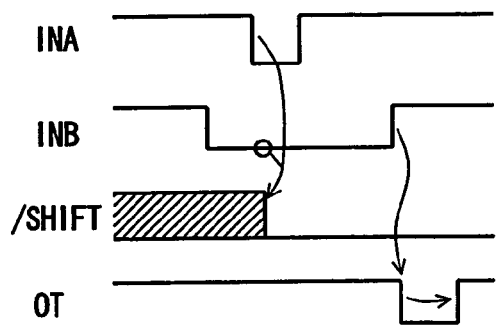
FIGS. 8A and 8B are signal waveform diagrams representing operations of the shifter shown in FIG. 7.
Figure 8B:
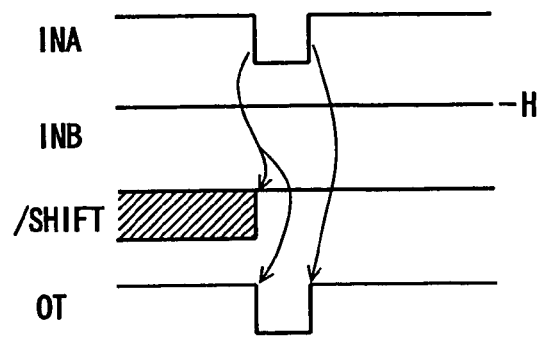

FIGS. 8A and 8B are timing charts representing operations of shifter 127 shown in FIG. 7. Brief description will now be given of operations of shifter 127 shown in FIG. 7 in the following, with reference to FIGS. 8A and 8B.

A case is considered in which as shown in FIG. 8A, when the signal (/REFE) applied to input node INB is at L level, the signal (/SETF) applied to input node INA is activated. CMOS transmission gate 127*b* is in a conductive state and CMOS transmission gate 127*e* is in a non-conductive state during a period in which the signal applied to input node INA is at H level and an output signal of inverter 127*c* rises to H level in accordance with the signal (/REFE) applied to input node INB.

Subsequently, when the signal applied to input node INA falls to L level, CMOS transmission gate 127*b* enters a non-conductive state, CMOS transmission gate 127*e* enters a conductive state and shift control signal /SHIFT from inverter 127*f* falls to L level. When the signal applied to input node INA rises to H level, CMOS transmission gate 127e enters a non-conductive state and shift control signal /SHIFT maintains the L level by the action of inverters 127f and 217g.

When shift control signal /SHIFT falls to L level, NOR gate 127i outputs a signal at L level even if the signal at input node INA falls to L level. On the other hand, trailing edge pule generation circuit 127m generates a one-shot pulse signal in response to a trailing edge (a rising) of a signal at input node INB and NOR gate 127j generates a one-shot pulse signal (the signal at L level) to output node OT in accordance with an output signal of trailing edge pulse generation circuit 127m.

Therefore, if the signal at input node INB is at L level when the signal at input node INA falls, activation of the signal at output node OT is shifted to as late as deactivation of the signal at input node INB.

On the other hand, when the signal applied to input node INA falls to L level as shown in FIG. 8B, shit control signal /SHIFT maintains the H level if the signal applied to input node INB is at H level. Therefore, in this case, since an output signal of inverter 127h shown in FIG. 7 falls to L level, an output signal of NOR gate 127i rises to H level in response to a falling of signal (/SETE) at input node INA and in response, the signal (/SET) at output node OT from NOR gate 127k falls to L level.

Therefore, an activation timing of output signal /SET of shifter 127 is selectively shifted according to a logical level of the signal (/REFE) at input node INB on a falling of the signal (/SETE) applied to input node INA to adjust a setting timing of set/reset flip-flop 128.

When the signal applied to input node INA falls from H level to L level to instruct data access, shifter 127 determines a logical level of the signal applied to input node INB to determine whether refreshing is under execution and to generate shift control signal /SHIFT. One of the signal applied to input node INA and the signal generated in the inactive state of the signal applied to input node INA is selected in accordance with shift control signal /SHIFT. Set/reset flip-flop 128 at the subsequent stage is set in accordance with output signal /SHIFT of shifter 127. A data access operation is activated in accordance with internal normal row activation signal /intRE from set/reset flip-flop 128. Therefore, a new data access can be performed after refresh is internally completed even if a data access instruction is applied during execution of refreshing, and thus, conflict between a refreshing operation and a data access operation can be avoided, thereby enabling reliable prevention of data destruction to perform data access.

Figure 9:
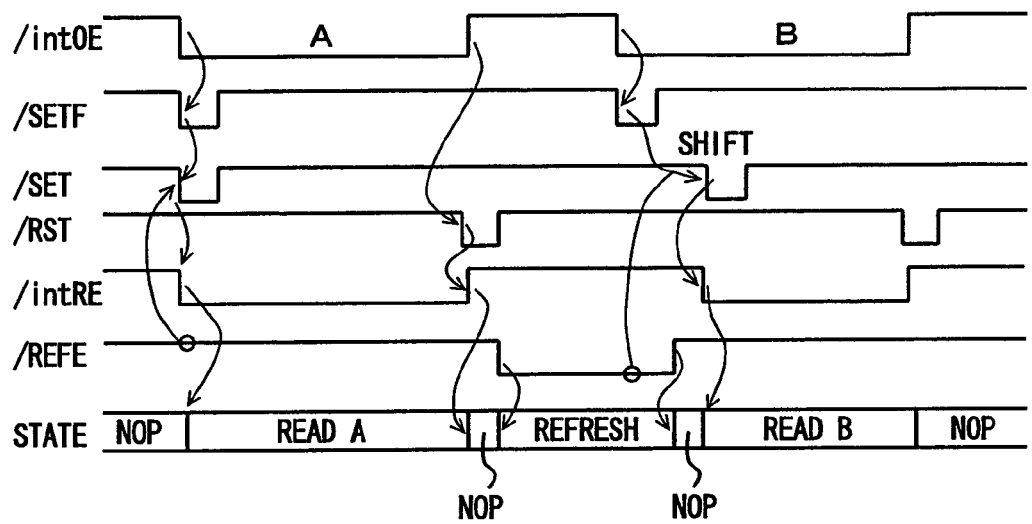
FIG. 9 is a timing chart representing an operation of the semiconductor memory device according to the first embodiment of the present invention.

FIG. 9 is a timing chart representing an operation of a row related control section included in main control circuit 20 shown in FIG. 6. Description will be given of an operation of the row related control section shown in FIG. 6 below with reference to FIG. 9. In FIG. 9, there is shown an operation when data reading is instructed as a data access instruction. Chip enable signal /CE is set at L level.

When internal output enable signal /intOE falls to L level, an output signal of composite AND gate 122 falls to L level. Trailing edge pulse generation circuit 124 generates a one-shot pulse signal in response to a falling of the output signal of composite AND gate 122. At this time, since refresh activation signal /REFE from refresh control circuit 40 is at H level, shifter 127 drives signal /SET to L level in response to a falling of the signal /SETF from trailing edge pulse generation circuit 124 without performing a shift operation. In response, set/reset flip-flop 128 is set and internal normal row activation signal /intRE is activated to perform a data read operation (read A) internally.

When internal output enable signal /intOE is raised to H level, in response to this rising, leading edge pulse generation circuit 126 generates a one-shot pulse signal, set/reset flip-flop 128 is reset in accordance with reset signal /RST from leading edge pulse generation circuit 126, internal normal row activation signal /intRE is deactivated, whereby an internal state is restored to the precharged state. Internally, only a precharging operation is performed, and therefore, an internal state is "NOP (no operation)" state.

When refresh activation signal /REFE is activated during a period in which internal normal row activation signal /intRE is at H level, refreshing is executed. Specifically, when refresh cycle signal /REFCYC is issued in a data access and refresh flag REFLG is set, the refresh window signal is activated in response to a rising of internal normal row activation signal /intRE to activate refresh activation signal /REFE.

When internal output enable signal /intOE is activated under execution of refreshing and a data read instruction is applied, the output signal /SETF of trailing edge pulse generation circuit 124 falls to L level. Since refresh activation signal /REFE is in an active state, shifter 127 delays activation of output signal /SET till deactivation of refresh activation signal /REFE.

When refresh activation signal /REFE is deactivated and a refreshing operation is completed, output signal /SET of shifter 127 is activated, set/reset flip-flop 128 is set to activate internal normal row activation signal /intRE, and data reading (read B) is executed.

If data access is designated in execution of reading, internal data access is delayed till completion of refreshing by virtue of the function of shifter 127. Furthermore, even if a refresh request is issued in data access, execution of refreshing is delayed till completion of data access. Therefore, conflict between refresh and data access can be prevented, thereby enabling prevention of data destruction due to conflict between internal operations.

Figure 10:
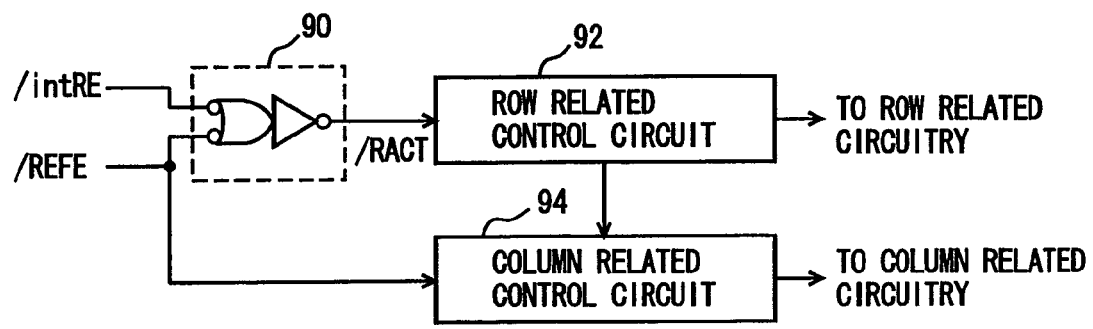
FIG. 10 is a diagram schematically showing a configuration of a main part of a main control circuit of the semiconductor memory device according to the first embodiment of the present invention.

FIG. 10 is a diagram schematically showing a configuration of a control signal generating section included in main control circuit 20 shown in FIG. 1. In FIG. 10, main control circuit 20 includes: a composite AND gate 90 receiving internal normal row activation signal /intRE and refresh activation signal /REFE; a row related control circuit 92 generating control signals for row related circuits such as a row decoder and a sense amplifier in accordance with an output signal /RACT of composite AND gate 90; and a column related control circuit 94 selectively activated under control of row related control circuit 92 to control operations of column related circuits such as a column decoder, an internal data write/read circuit and a data line equalize circuit.

Column related control circuit 94 prohibits a column related operation while refresh activation signal /REFE is in an active state.

Row related control circuit 92 controls operations related to selection of a row of memory cells in a data access operation, and specifically performs activation of a row decoder, driving of a word line into a selected state and activation of a sense amplifier in a prescribed sequence. When a sensing operation by the sense amplifier is completed, column related control circuit 94 is activated to execute a column select operation in a normal mode of operation. Data writing and reading are determined by write enable signal /WE and output enable signal /OE applied externally.

As shown in FIG. 10, when internal normal row activation signal /intRE or refresh activation signal /REFE is activated, array activation signal /RACT is activated to execute a row select operation internally. Simultaneous activation of internal normal row activation signal /intRE and refresh activation signal /REFE is prevented, and therefore, one of a refreshing operation and a data access operation is performed reliably.

According to the first embodiment of the present invention, as described above, if a data access instruction is applied during a refreshing operation, data access can be prevented from being performed during a refreshing operation since a start timing of data access is shifted until completion of refresh, thereby enabling data access with correctness without causing data destruction.

Note that refresh activation signal /REFE and internal normal row activation signal /intRE are preferably activated after an internal state is restored to an initial state (a precharged state). Therefore, after the internal state reliably restores to the initial state, the next operation can be started. Accordingly, the internal operation state is reliably prevented from entering a next operation during a so-called RAS precharge period, thereby enabling reliable prevention of data destruction owing to interruption of a restoration operation toward the initial state.

Second Embodiment

Figure 11:
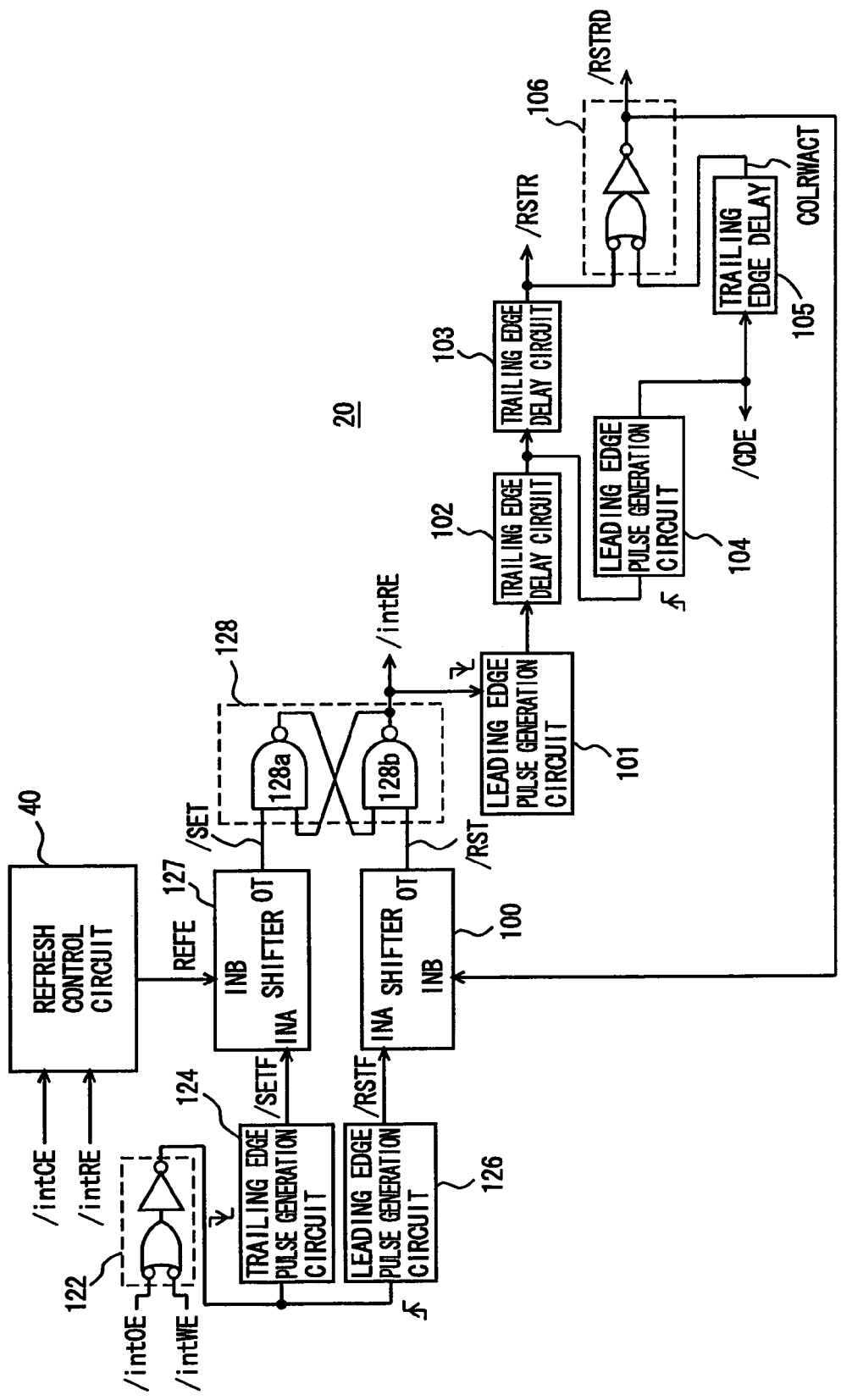
FIG. 11 is a diagram schematically showing a configuration of a main control circuit according to a second embodiment of the present invention.

FIG. 11 is a diagram schematically showing a configuration of a main control circuit according to a second embodiment of the present invention. In the configuration of main control circuit 20 shown in FIG. 11, different from the configuration of the main control circuit shown in FIG. 6, reset fast signal /RSTF outputted by leading edge pulse generation circuit 126 is applied to set/reset flip-flop 128 through a shifter 100. Shifter 100 shifts activation of reset signal /RST in accordance with whether a delayed restore period signal /RSTRD is at H level or L level when reset fast signal /RSTF falls to L level. Shifter 100 has the same configuration as the configuration shown in FIG. 7 and is constructed of a circuit for determining a logical level of a signal applied to input node INB when a signal applied to input INA falls to L level, and a selector for selecting one of a shift signal and a non-shit signal in accordance with the result of determination (shift control signal /SHIFT).

A path for generating delayed restore period signal /RSTRD includes: a leading edge pulse generation circuit 101 generating a one-shot pulse signal in response to a leading edge of internal normal row activation signal /intRE; a trailing edge delay circuit 102 expanding a pulse width by delaying a trailing edge of leading edge pulse generation circuit 101; a trailing edge delay circuit 103 for further delaying a trailing edge of an output pulse signal of trailing edge delay circuit 102 to expand a pulse width to generate restore period signal /RSTR; a leading edge pulse generation circuit 104 generating a one-shot pulse signal in response to a leading edge of an output signal of trailing edge delay circuit 102 to activate a column activation signal /CDE; trailing edge delay circuit 105 delaying a trailing edge of column activation signal/CDE to generate a column recovery period signal COLRWACT; and a composite AND gate 106 receiving restore period signal /RSTR and column recovery period signal COLRWCT to generate a delayed restore period signal /RSTRD.

Internal normal row activation signal /intRE defines a period during which a row is internally in a selected state, and indicates that an internal state restores to an initial state when deactivated.

Restore period signal /RSTR defines a period (restore period) between a time when memory cell data is read out internally and a time when the read out data is rewritten to the original memory cell.

Column activation signal /CDE defines an activation period of column related circuitry. Delayed restore period signal /RSTRD reliably provides a period in which row related circuitry is restored to the initial state. Column recovery period signal COLRWACT reliably provides a recovery period from when column activation signal /CDE is deactivated till a column related circuit restores to the initial state.

In the configuration shown in FIG. 11, when the next data access instruction is applied in a period during which a restore operation is internally performed or in a column recovery period, acceptance of the next data access is delayed till completion of the restore operation or the column recovery period. Accordingly, a restore period and a recovery period can be provided with certainty and the next operation can be started after the internal state is restored to the initial state with certainty, and thus, destruction of internal data can be prevented from occurring.

Figure 12:
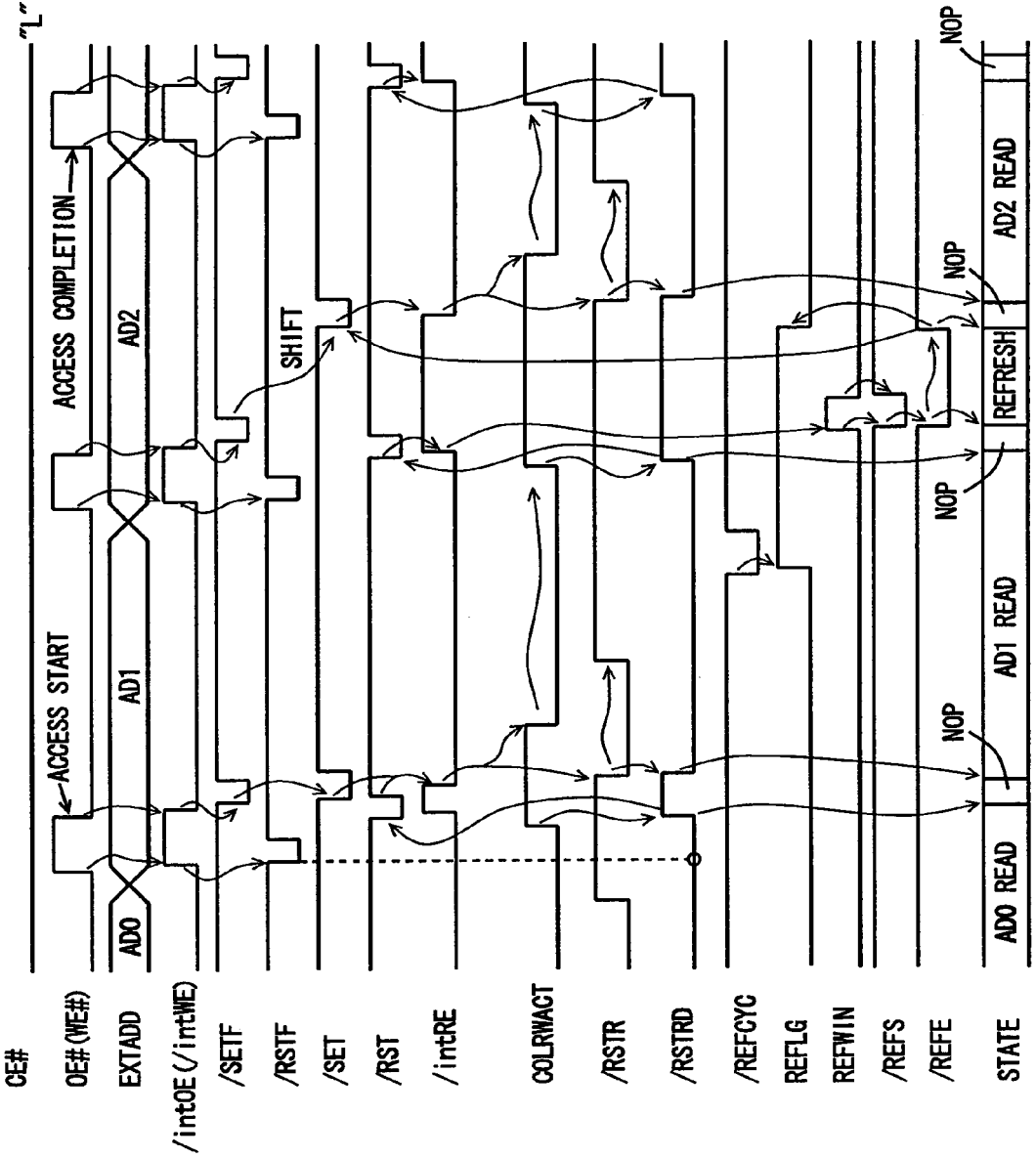
FIG. 12 is a timing chart representing an operation of a refresh control circuit and the main control circuit shown in FIG. 11.

FIG. 12 is a timing chart representing an operation of main control circuit 20 and fresh control circuit 40 shown in FIG. 11. Description will be now given of operations in the control circuit shown in FIG. 11 with reference to FIG. 12.

When external output enable signal OE# (or external write enable signal WE#) rises to H level, completion of data access (read or write) operation by a current address signal AD0 is instructed. Internal output enable signal /intOE (or internal write enable signal /intWE) rises in response to external output enable signal OE# (or external write enable signal WE#). Reset fast signal /RSFT from leading edge pulse generation circuit 126 falls to L level in response to a rising (leading edge) of internal output enable signal /intOE (or internal write enable signal /intWE). At this time, if delayed restore period /RSTRD is at H level, shifter 100 shifts activation of reset signal /RST internally till delayed restore period signal /RSTRD rises to H level.

When delayed restore period /RSTRD rises to H level, the memory cell array is internally driven to the inactive state and reset signal /RST is activated to cause internal normal row activation signal intRE to rise to H level. A data read operation for address AD0 is completed in response to a rising of delayed restore period signal /RSTRD.

Subsequently, when a data access instruction (activation of the output enable signal or the write enable signal) is applied, internal data access instruction signal (internal output enable signal /intOE or internal write enable signal /intWE) is activated and in response, signal /SETF from trailing edge pulse generation circuit 124 is activated to L level. At this time, since refresh activation signal /REFE is at H level, shifter 127 performs no shifting operation, and set signal /SET is activated in response to activation of set fast signal /SETF applied to input INA. In response, set/reset flip-flop 128 is set and internal normal row activation signal /intRE is again activated.

Leading edge pulse generation circuit 101 generate a one shot pulse in response to activation of internal normal row activation signal /intRE and in response, restore period signal /RSTR is activated. Delayed restore period signal /RSTRD is again activated in accordance with activation of restore period signal /RSTR. It is shown that by activation of restore period signal /RSTR, selection of a memory cell row is internally performed and a data restore operation is performed on selected memory cells. Restore period signal /RSTR is maintained in active state during the delay time that trailing edge delay circuits 102 and 103 have in combination. With restore period signal /RSTR applied, a period necessary for completion of data restoration is acquired.

On the other hand, when an output signal of trailing edge delay circuit 102 rises to H level, column activation signal /CDE from leading edge pulse generation circuit 104 is activated to allow a column selection operation. By a rising of the output signal of trailing edge delay circuit 102, it is indicated that the sensing operation is completed and a column interlock period is ended.

A column selection is performed in accordance with activation of column activation signal /CDE and, during this period, column access activation signal COLRWACT maintains the active state.

On the other hand, when refresh cycle signal /REFCYC is activated in refresh control circuit 40 during data access according to an address AD1, refresh flag REFLG, as shown in FIG. 4, is activated to indicate a state in which refreshing is requested.

When a delay time that trailing edge delay circuit 105 has elapses, column recovery period signal COLRWACT is deactivated, and in response, delayed restore period signal /RSTRD is deactivated, shifter 100 activates reset signal /RST and deactivates internal row activation signal intRE. With such series of operations, a data access cycle for address AD1 is completed.

Refresh window signal REFWIN from determination circuit 60 shown in FIG. 5 is activated and is kept in an active state for a prescribed period in response to deactivation of internal normal row activation signal intRE and it is determined whether refresh should be executed. Since refresh flag REFLG is at H level, refresh set signal /REFS shown in FIG. 2 is kept at L level for a prescribed period and in response, set/reset flip-flop 45 (see FIG. 2) is set and refresh activation signal /REFE is activated and a refreshing operation is performed. When an access instruction for the next address AD2 is applied during a period of activation of refresh activation signal /REFE, shifter 127 performs a shifting operation, while when refresh activation signal /REFE is deactivated, the set signal /SET is activated without shifting. In response, internal normal row activation signal /intRE is activated, restore signal /RSTR is again activated, delayed restore period signal /RSTRD is also activated and select operations on memory cell row and column are performed in accordance with address AD2, followed by external data reading (in activation of output enable signal /OE).

Therefore, as shown in FIG. 11, by deactivating internal normal row activation signal /intRE with delayed restore period signal /RSTRD, precharge periods for a row related operation and a column related operation can be certainly provided. Thus, a subsequent operation can be started reliably after completion of a restore operation and a recovery operation, thereby enabling prevention of destruction of data.

Figure 13:
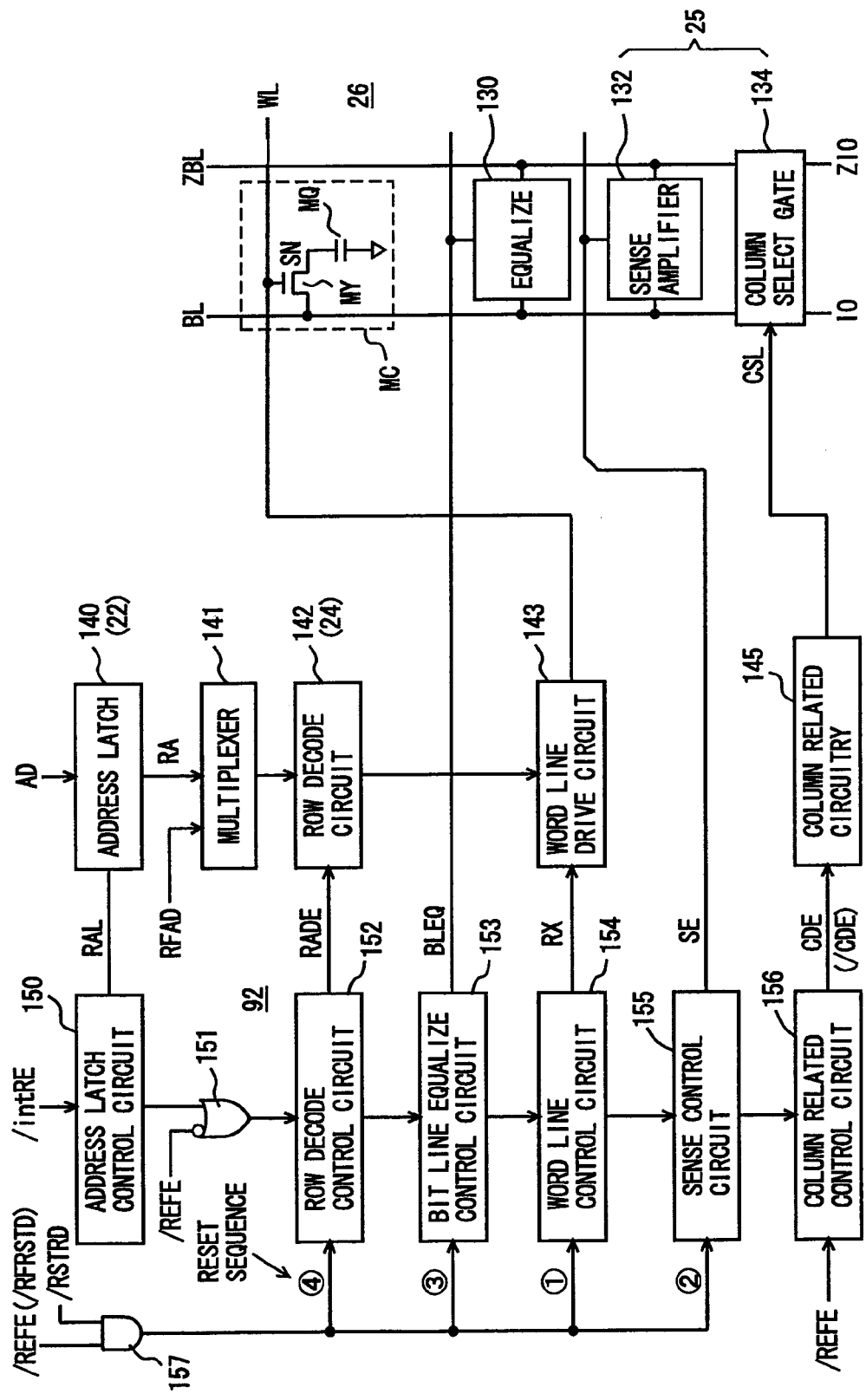
FIG. 13 is a diagram schematically showing a configuration of a main part of the semiconductor memory device according to the second embodiment of the present invention.

FIG. 13 is a diagram schematically showing a configuration of a main part of the semiconductor memory device according to a second embodiment of the present invention. In FIG. 13, there are schematically shown configurations of memory array 26 and sense amplifier/input and output control circuit 25, which are shown in FIG. 1, and row related circuits to perform operations associated with a row selection and row related control circuitry to control operations of the row related circuits.

In FIG. 13, in memory cell array 26, memory cells MC are arranged in rows and columns. Word lines WL are provided corresponding to the respective rows of memory cells MC and pairs of bit lines BL and ZBL are provided corresponding to the respective columns of memory cells MC. In FIG. 13, one memory cell MC is shown as a representative.

Memory cell MC includes a memory cell capacitor MQ storing information in an electric charge form, and an access transistor MT connecting memory cell capacitor MQ to a corresponding bit line BL or ZBL in accordance with a signal on a corresponding word line.

Bit lines BL and ZBL are arranged in a pair. Bit lines BL and ZBL are provided with: a bit line equalize circuit 130 precharging and equalizing bit lines BL and ZBL to a prescribed voltage VBL when activated; a sense amplifier 132 differentially amplifying and latching potentials on bit lines BL and ZBL when activated; and a column select gate 134 rendered conductive in accordance with column select signal CSL and connecting bit lines BL and ZBL to internal data lines IO and ZIO when made conductive. Sense amplifier 132 and column select gate 134 correspond to components of a block of sense amplifier/input and output control circuit 25.

The row related circuitry include: an address latch 140 incorporating address signal AD applied on activation of row address latch instruction signal RAL to generate internal row address signal RA; a multiplexer 141 selecting one of refresh address signal RFAD from refresh control circuit 40 and internal row address signal RA from address latch 140; a row decode circuit 142 decoding a row address signal applied through multiplexer 141 on activation of row address decode enable signal RADE; and a word line drive circuit 143 driving an addressed word line in accordance with an output signal of row decode circuit 142 into selected state in response to activation of a word line drive timing signal RX.

The row related circuitry further include an equalize circuit 130 and a sense amplifier 132, and are controlled by the row related control circuit (corresponding to the row related control circuit 92 shown in FIG. 10).

The row related control circuit includes: an address latch control circuit 150 activating address latch instruction signal RAL in response to activation of internal normal row activation signal /intRE; a gate circuit 151 generating an activation signal in response to activation of one of an output signal of address latch control circuit 150 and refresh activation signal /REFE; a row decode control circuit 152 activating row address decode enable signal RADE in response to activation of an output signal of gate circuit 151; a bit line equalize control circuit 153 deactivating a bit line equalize instruction signal BLEQ in response to activation of row address decode enable signal RADE from row decode control circuit 152; a word line control circuit 154 activating a word line drive timing signal RX in response to deactivation of bit line equalize instruction signal BLEQ from bit line equalize control circuit 153; and a sense control circuit 155 activating a sense amplifier activation signal SE upon elapse of a prescribed period in response to activation of word line drive timing signal RX.

Bit line equalize instruction signal BLEQ from bit line equalize control circuit 153 is applied to bit line equalize circuit 130 and sense amplifier activation signal SE from sense control circuit 155 is applied to sense amplifier 132. When sense amplifier activation signal SE from sense control circuit 155 is activated, as shown in FIG. 11, column activation signal /CDE (CDE) from column related control circuit 156 is activated in accordance with activation of restore period signal to operate column related circuitry 145.

Column related circuitry 145 include a column decoder, internal data line equalize circuit, an internal write circuit and an internal read circuit. In FIG. 13, there is representatively shown generation of column select signal CSL from column related circuitry 145. Column related circuitry 145 may include a write driver for generating and writing internal write data to a selected memory cell, and a preamplifier for amplifying read data from a selected memory cell, as an internal write circuit and an internal read circuit. A column select gate 134 may be included in column related circuitry 145.

Column control circuit 156 is maintained in a reset state when refresh activation signal /REFE is active and a column select operation is prohibited.

As a reset circuit initializing the row related control circuit, there is provided a gate circuit 157 receiving delayed restore period signal /RSTRT and refresh activation signal /REFE. Control circuits, starting from row decode control circuit 152, to sense control circuit 155 are reset in a prescribed sequence in accordance with an output signal of gate circuit 157. The sequence of this resetting operation is such that first, word line drive timing signal RX is deactivated and then, sense amplifier activation signal SE is deactivated. Thereafter, bit line equalize instruction signal BLEQ is activated to perform equalization and precharging of bit lines and to thereafter cease a row decode operation. Internal normal row activation signal /intRE is deactivated in response to deactivation of row decode operation. Internal normal row activation signal /intRE is a signal indicating an internal state and deactivated when an internal state is restored to its initial state.

Refresh activation signal /REFE indicates that the internal state is in a refresh state. Therefore, as shown in the parentheses in FIG. 13, the row related control circuit is reset using refresh restore period signal /RFRSTD completing a refreshing operation internally when a prescribed period elapses from activation of refresh activation signal /REFE. Refresh activation signal /REFE is deactivated in response to deactivation of refresh restore period signal /RFRSTD, to indicate release from a refresh state and to permit the next data access.

Figure 14:
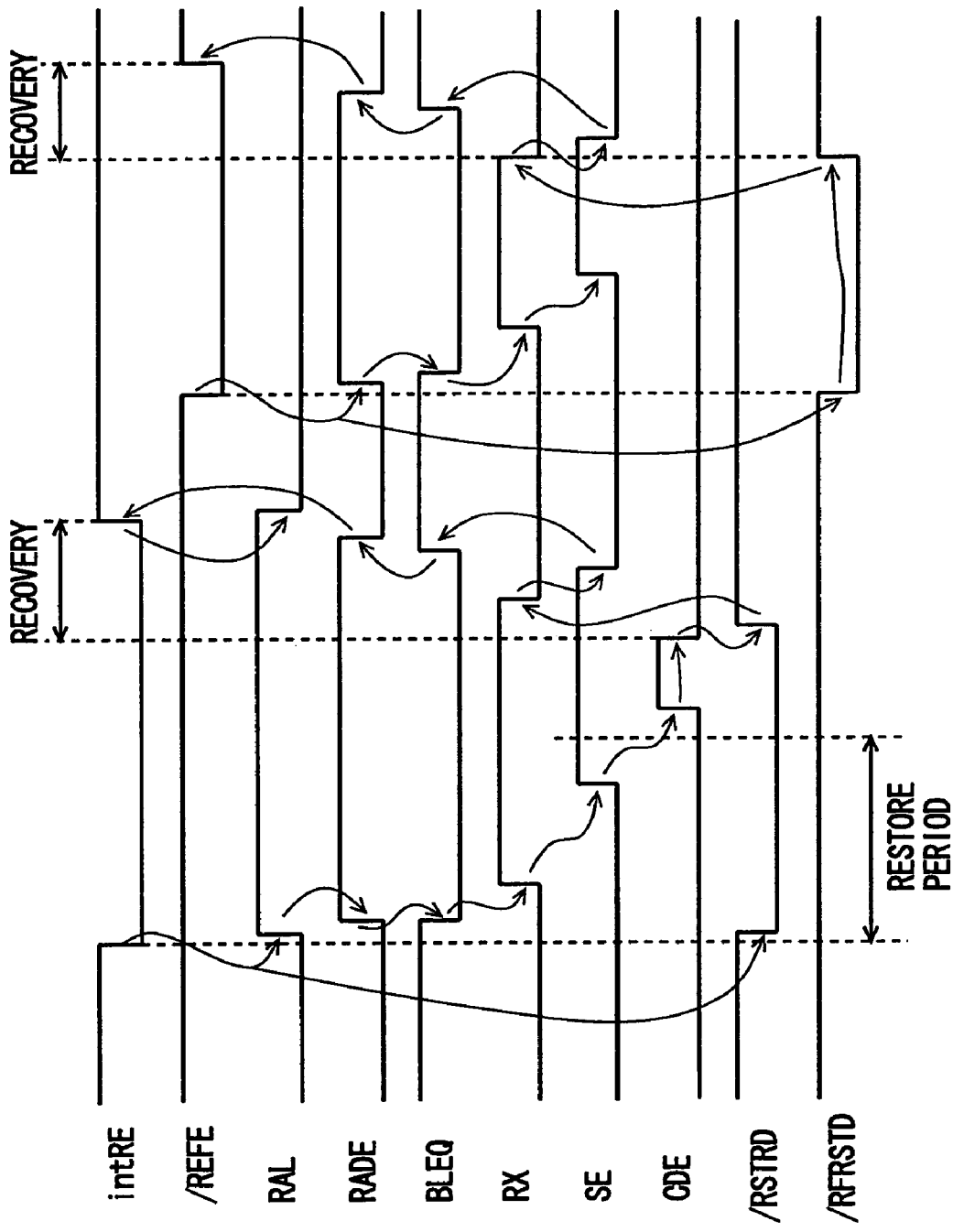
FIG. 14 is a signal waveform diagram representing an operation of the circuit shown in FIG. 13.

FIG. 14 is a timing chart representing an operation of the circuits shown in FIG. 13. Description will be given of operations of the configuration shown in FIG. 13 below with reference to FIG. 14. In a normal data access operation, internal normal row activation signal /intRE is activated in accordance with a data access instruction and in response, delayed restore period signal RSTRD is activated. Row address latch instruction signal RAL from address latch control circuit 150 is activated in response to activation of internal normal row activation signal /intRE and address latch 140 latches an applied signal to generate row address signal RA.

Then, row address decode enable signal RADE outputted by row decode control circuit 152 is activated in accordance with activation of an output signal of gate circuit 151, followed by deactivation of bit line equalize instruction signal BLEQ. Row decode circuit 142 starts a decoding operation, while an equalizing operation on bit lines BL and ZBL ceases to cause bit lines BL and ZBL to be in floating state.

Then, word line drive timing signal RX from word line control circuit 154 is activated and a word line WL on an addressed row is driven into a selected state by word line drive circuit 143 in accordance with word line select signal outputted by row decode circuit 142.

Then, sense control circuit 155 activates sense amplifier activation signal SE at prescribed timing and sense amplifier 132 senses, amplifies and latches data read out onto bit lines BL and ZBL. A restore period is acquired by restore period signal /RSTR. The restore period is a period during which a row selection operation is at first started, sense amplifier activation signal SE is then activated, potentials on bit lines BL and ZBL are made definite and original data is written into a memory cell MC.

When a so-called column interlock period elapses after sense amplifier activation signal SE is activated, column activation signal /CDE (CDE) is activated, column related circuits operate to perform a column select operation and data access is performed. Column activation signal /CDE (CDE) is a one-shot pulse signal as shown in FIG. 11 and the column select operation ceases when a prescribed period elapses. Restoration of column related circuits to the initial states is performed after deactivation of column activation signal /CDE (CDE), to start a column recovery period.

When column activation signal /CDE (CDE) is deactivated, column recovery period signal COLRWACT is deactivated when a column recovery period elapses and delayed restore period signal /RSTRD is deactivated. In an initialization sequence of row related control signals, word line control circuit 154 is first reset and then word line drive timing signal RX is deactivated. Subsequently, sense control circuit 155 is deactivated, and sense amplifier activation signal SE is deactivated to deactivate sense amplifier 132.

Then, bit line equalize instruction signal BLEQ is activated to equalize potentials at power supply voltage level and ground voltage level on bit lines BL and ZBL. When the equalization starts, row decode control circuit 112 is reset, row address decode enable signal RADE is deactivated and then internal normal row activation signal /intRE is deactivated. In response, address latch 140 is released from the latching state and enters a state accepting the next address.

A recovery period is a period between the time at which column activation signal CDE is deactivated and the time at which internal normal row activation signal /intRE is driven into inactive state (H level) and an erroneous operation is prevented during this period by the signal /ZSTRD.

In a refreshing operation, refresh activation signal /REFE is activated and a row address decode enable signal RADE from row decode control circuit 52 is activated. In a refreshing operation, multiplexer 141 selects refresh address RFAD for application to row decode circuit 142. Then, similar to a normal data access, word line control circuit 154 and sense control circuit 155 are sequentially activated, a word line corresponding to a refresh address is driven into selected state by word line drive circuit, and there are performed sensing, amplification and re-writing by sense amplifier 132 on data of memory cells connected to a refresh row.

In a refreshing operation, refresh restore period signal /RFRSTD is generated and word line drive timing signal RX is deactivated when a prescribed time elapses, followed by deactivation of sense amplifier activation signal SE. Thereafter, bit line equalize instruction signal BLEQ is activated to equalize bit lines to a prescribed voltage, followed by deactivation of row decode control circuit 152. Thereafter, refresh activation signal /REFE is deactivated.

Therefore, when a so-called restore period ends in a refreshing operation, a word line is driven into non-selected state. A recovery period in refreshing is a period starting at the time at which refresh restore period signal /RFRSTD rises to H level and ending at the time at which refresh activation signal /REFE is deactivated.

In order to deactivate internal normal row activation signal /intRE or refresh activation signal /REFE after row address decode enable signal RADE is deactivated, these signals may be deactivated directly using the relationship in signal response or alternatively, deactivation of these signals may be achieved by simply adjusting a delay time of a delay circuit. For example, as to refresh activation signal /REFE, in the configuration shown in FIG. 2, the output signal φA2 of delay circuit 49 is used as refresh restore period signal /RFRSTD and set/reset flip-flop 45 is reset in response to a falling of row address decode enable signal RADE. According to such configuration, the signal waveforms in refreshing shown in FIG. 14 can be achieved readily.

Internal normal row activation signal /intRE and refresh activation signal /REFE each indicate the internal state. When the internal state is reset, the internal circuitry substantially returns to the initial state and therefore, the internal operation control signals are activated or deactivated for the next operation cycle. Thus, the next data access can be started immediately after completion of refreshing, while providing reliably a so-called RAS precharge time in DRAM. In this case, a time from deactivation of delayed restore period signal /RSTRD till deactivation of internal normal row activation signal /intRE is merely required to be a time width defined by the so-called RAS precharge time.

Figure 15:
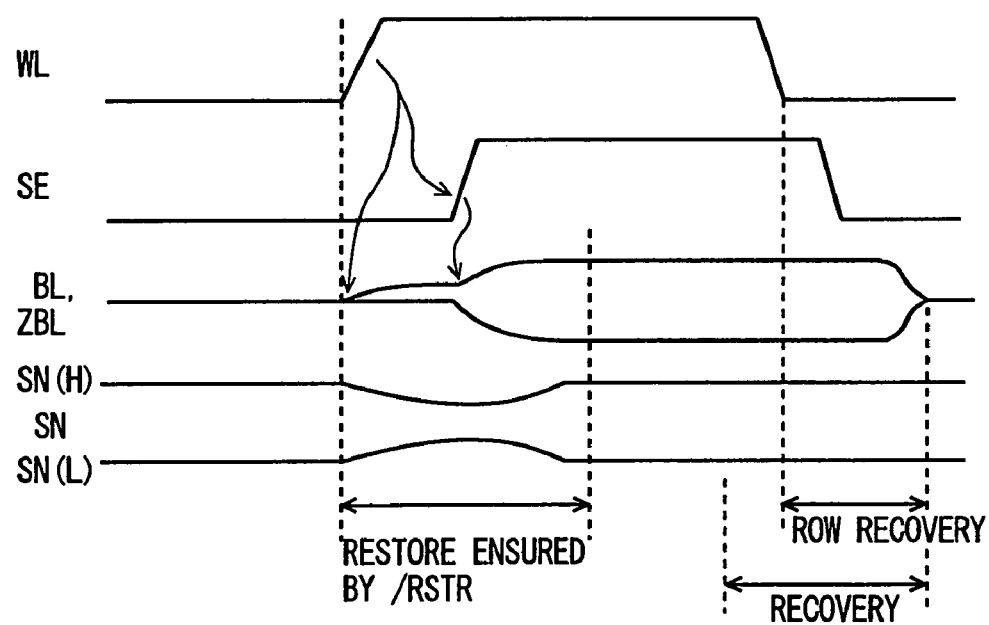
FIG. 15 is a signal waveform diagram representing an operation of a memory cell array shown in FIG. 13.

FIG. 15 is a diagram schematically showing changes in potential at storage node SN of a memory cell shown in FIG. 13. In FIG. 15, there are shown a potential SN <H> where H level data is stored in storage node SN and a potential SN <L> where L level data is stored in storage node SN.

When a word line WL is selected, electric charges corresponding to storage data in memory cell MC are transmitted onto bit line BL or ZBL from memory cell capacitor MQ. In FIG. 15, there is shown a signal waveform on bit lines where H level data is read. When word line WL is selected and access transistor MT is rendered conductive, storage node SN and bit line BL (ZBL) are connected to each other. Bit lines BL and ZBL have been equalized to, for example, intermediate voltage level and electric charges are migrated between bit line BL (or ZBL) and storage node SL to change the potential at storage node SN.

Then, sense amplifier 132 is activated to drive bit lines BL and ZBL to power supply voltage level and ground voltage level, thereby electric charges on bit line BL or ZBL are transmitted to storage node SN of the memory cell and the potential at storage node SN is recovered to its original potential SN <H> or SN <L>. A restore period is a time during which a potential at storage node SN of memory cell MC is recovered to its original potential level and restore period signal /RSTR ensures the restoring period.

When word line WL is driven into non-selected state, sense amplifier activation signal SE is deactivated. Subsequently, bit line equalize instruction signal is activated to equalize bit lines BL and ZBL to the prescribed precharge voltage level. In data access, a column selection operation has been completed prior to deactivation of word line WL. Therefore, an actual column recovery time is started prior to deactivation of word line. A period required for resetting of row related circuitry, that is, a row recovery time starts at deactivation of word line WL as the starting point. The recovery period is ensured by the signals COLRWACT and /RSTRD.

Therefore, even if a data access completion instruction (or a refresh completion instruction) is applied during a restore operation or a recovery operation, which is a transition state, the next data access can be performed reliably after the end of the restore period or the recovery period. Thus, data destruction can be reliably prevented without interrupting a data restoring operation or a column recovery operation.

Third Embodiment

Figure 16:
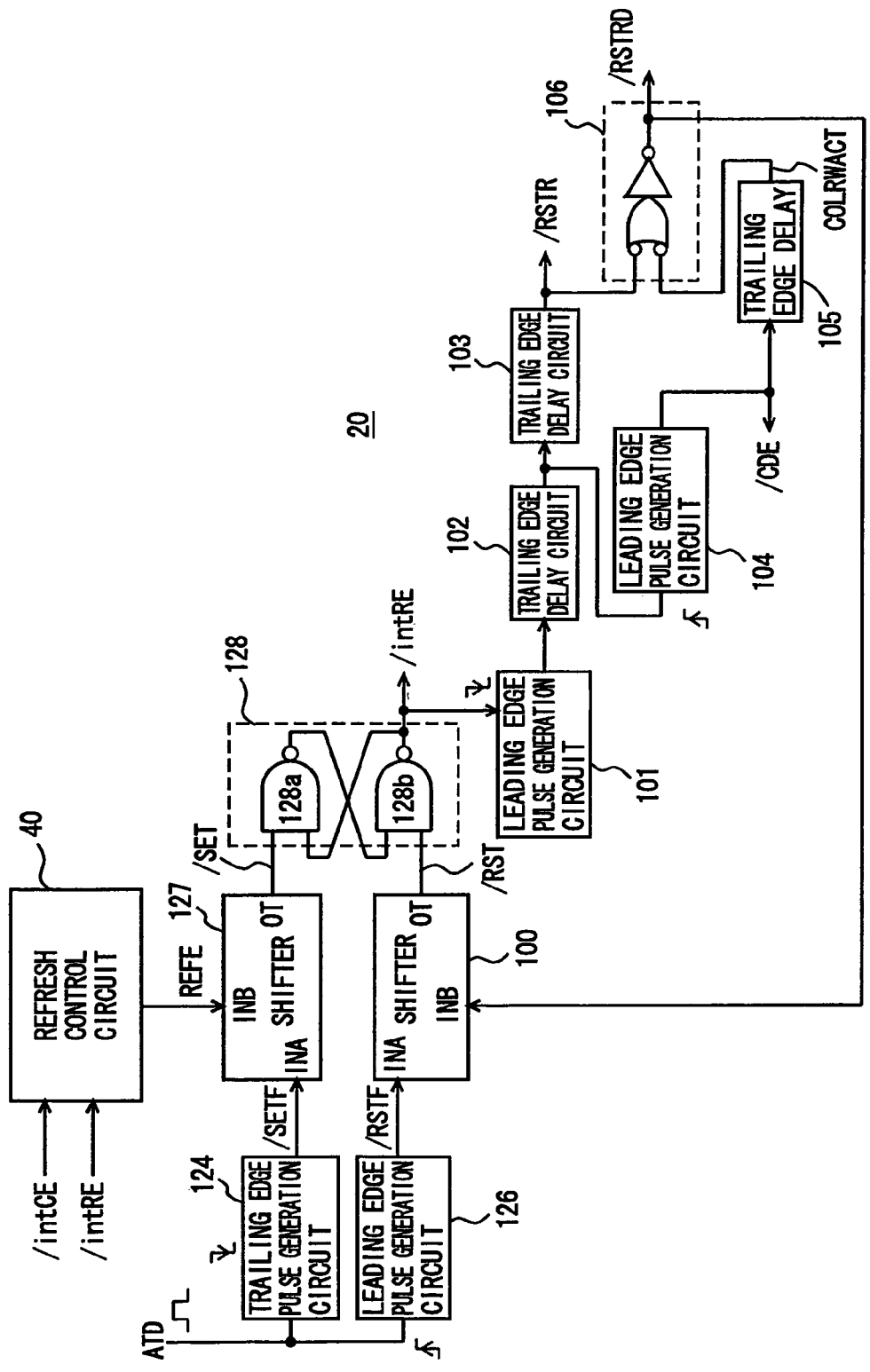
FIG. 16 is a diagram schematically showing a configuration of a main part of a semiconductor memory device according to a third embodiment of the present invention.

FIG. 16 is a diagram schematically showing a configuration of main control circuit 20 of a semiconductor memory device according to a third embodiment of the present invention. The configuration of main control circuit 20 shown in FIG. 16 is different from the configuration of the main control circuit shown in FIG. 11 in the following point. Specifically, an address transition detection signal ATD is applied to trailing edge pulse generation circuit 124 and leading edge pulse generation circuit 126. The other parts of the configuration are the same as corresponding parts of the configuration of the main control circuit shown in FIG. 11, the same reference numerals are attached to corresponding components and detailed descriptions thereof will not be repeated.

In a case of the main control circuit shown in FIG. 16, the starting point of an internal operation is provided by address transition detection signal ATD, rather than internal output enable signal intOE or write enable signal /intWE. Data access completion is designated by a rising of address detection signal ATD and data access cycle start is designated by a falling of address transition detection signal ATD.

Figure 17:
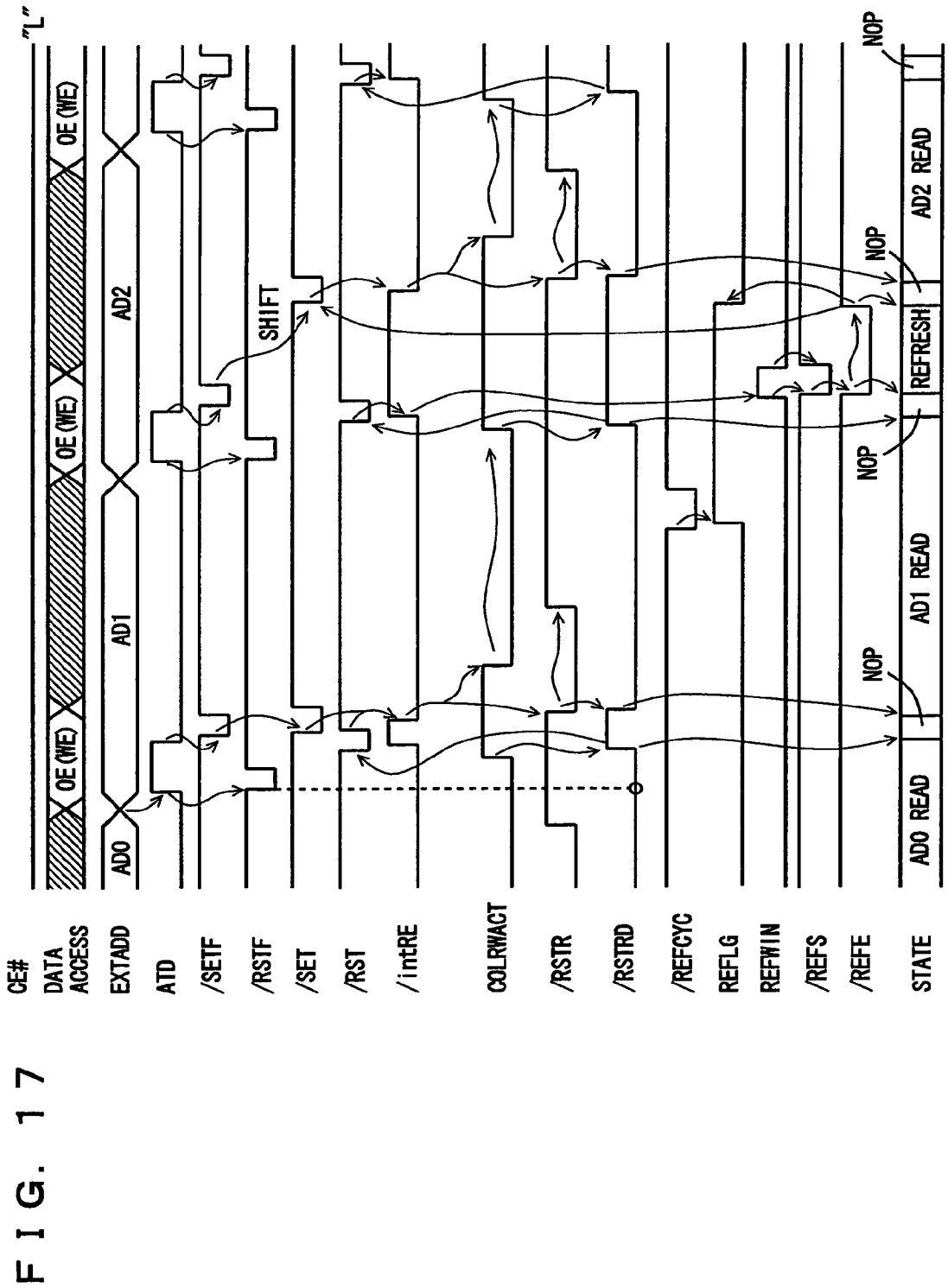
FIG. 17 is a timing chart representing an operation of the circuitry shown in FIG. 16.

FIG. 17 is a timing chart representing an operation in main control circuit 20 shown in FIG. 16. As being clear from the timing chart shown in FIG. 17, address transition detection signal ATD is employed instead of internal output enable signal /intOE or internal write enable signal /intWE and the operation manner in signal waveforms shown in FIG. 17 is the same as that in the waveforms shown in FIG. 12.

Employment of address transition detection signal ATD to define a memory cycle achieves a fully hidden refresh DRAM having compatibility with an address transition detection interface, which is most commonly used as an SRAM interface.

Writing/reading of data is designated by a data access instruction (output enable signal OE or write enable signal WE) applied simultaneously in parallel to an address signal.

Figure 18:
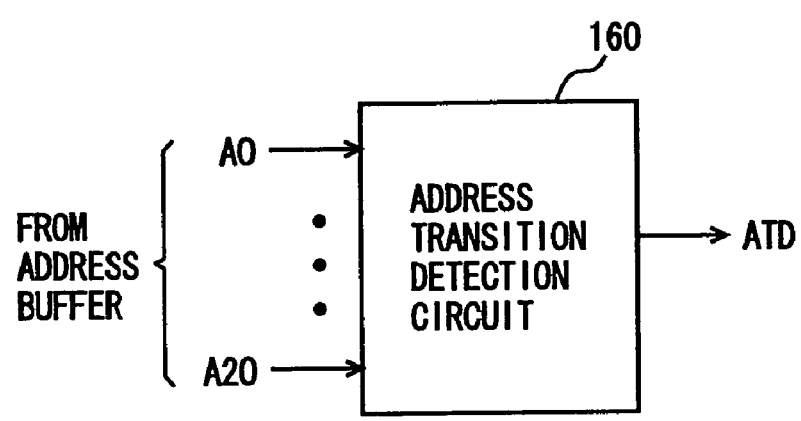
FIG. 18 is a diagram schematically showing a configuration of a part for generating an address transition detection signal in the third embodiment of the present invention.

FIG. 18 is a diagram schematically showing a part generating an address transition detection signal. In FIG. 18, address transition detection signal ATD is generated by an address transition detection circuit 160 receiving internal address signal bits A0 to A20 from an address buffer. Address transition detection circuit 160 detects a transition of each address bit and activates address transition detection signal ATD when detecting a transition of at least one address bit. Address transition detection units provided to the respective bits each include, for example, a delay circuit delaying a corresponding address bit Ai, and a non-coincidence detection circuit receiving an output signal of the delay circuit and address bit Ai. Address transition detection signal ATD is generated by an OR gate receiving output signals of the non-coincidence detection circuits for all bits. A circuit configuration as a substitute may be used in which address transition detection signal ATD in the form of one shot pulse having a prescribed time width is generated in response to an address transition detection signal activated at the fastest timing.

No refresh address signal is applied to address transition detection circuit 160. This is because in a refreshing operation, a refreshing start timing is determined according to refresh activation signal /REFE. In external data access, it is only required to detect a transition in external address bits. By avoiding conflict between a refreshing operation and a data access operation internally on the basis of the address transition detection signal, there can be provided a fully hidden refresh DRAM with an interface having perfect compatibility with an SRAM with an address transition detection interface.

According to the third embodiment of the present invention, as described above, there can be achieved a fully hidden refresh DRAM having compatibility with an SRAM with an address transition detection interface, in which address transition detection signal ATD is employed as a signal providing the starting point of an internal operation timing.

Fourth Embodiment

Figure 19:
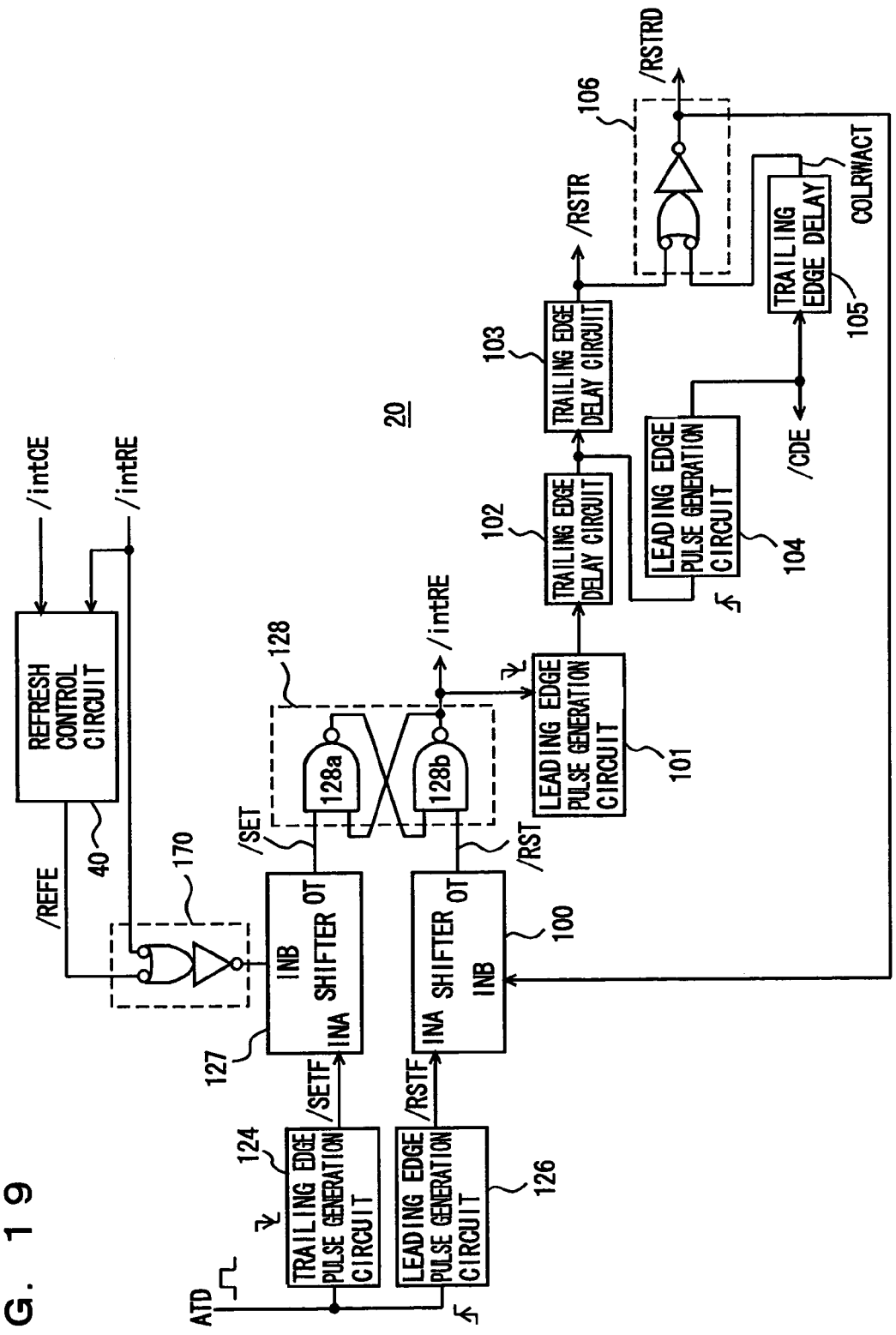
FIG. 19 is a diagram schematically showing a configuration of a main part of a semiconductor memory device according to a fourth embodiment of the present invention.
Figure 20:
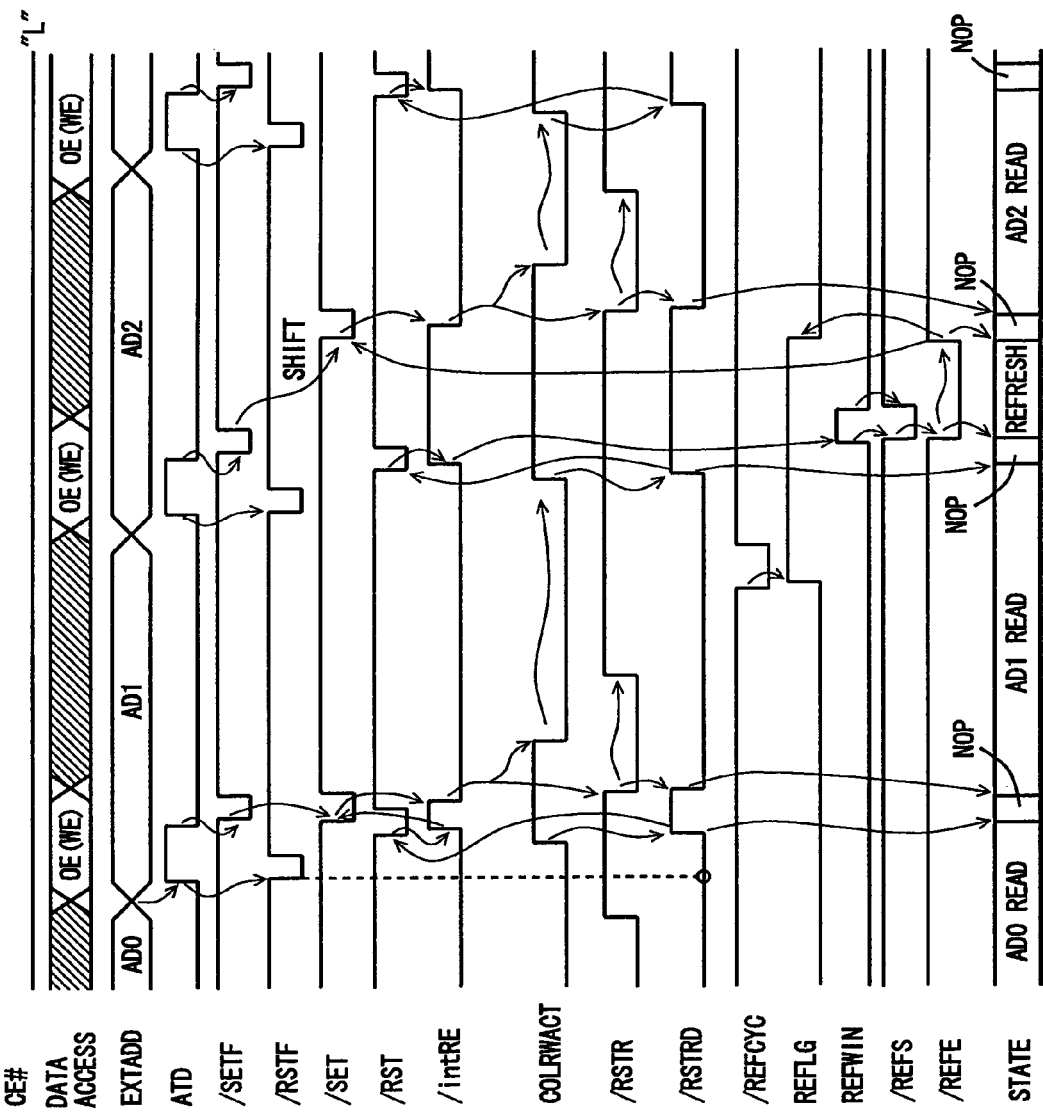
FIG. 20 is a timing chart representing an operation of the circuitry shown in FIG. 19.
Figure 21:
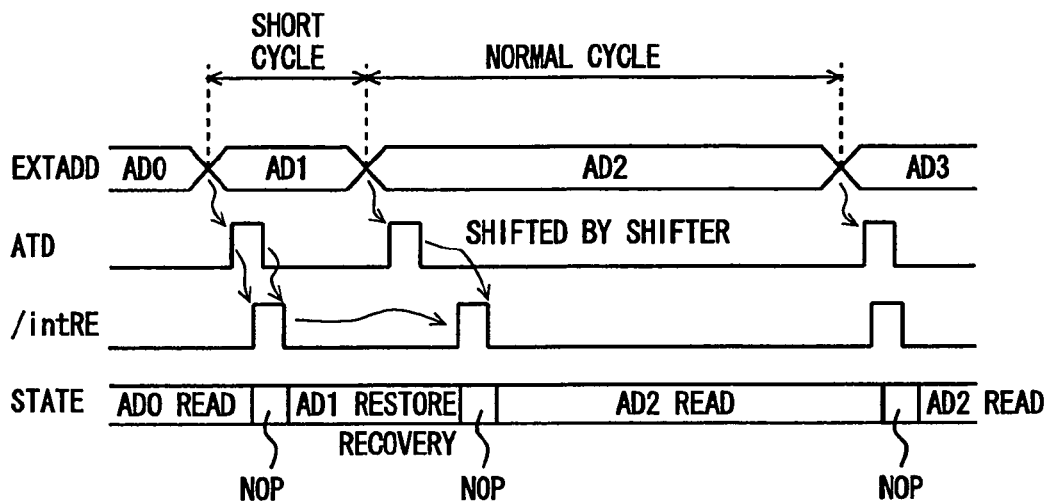
FIG. 21 is a timing chart schematically representing an operation of the semiconductor memory device in the fourth embodiment of the present invention.

FIG. 19 is a diagram schematically showing a configuration of a main control circuit according to a fourth embodiment of the present invention. The configuration of the main control circuit shown in FIG. 19 is different from that of the main control circuit shown in FIG. 16 in the following point. That is, a composite AND gate 170 is provided to shifter 127 that sets set/reset flip-flop 128 activating intern abnormal row activation signal /intRE. Composite AND gate 170 receives refresh activation signal /REFE from refresh control circuit 40 and internal normal row activation signal /intRE to apply an output signal thereof to input node INB of shifter 127. The other configuration of main control circuit 20 shown in FIG. 19 is the same as the configuration of the main control circuit shown in FIG. 16, the same reference numerals are attached to corresponding components and detailed descriptions thereof will not be repeated. Description will be below given of operations in circuits shown in FIG. 19 with reference to FIG. 20.

A state is considered where, in the configuration of the main control circuit shown in FIG. 19, address transition detection signal ATD is generated while delayed recovery period signal /RSTRD is active before completing a recovery operation. In this state, reset fast signal /RSTF from leading edge pulse generation circuit 126 falls from H level to L level in response to address transition detection signal ATD. Since delayed recovery period signal /RSTRD is at L level, however, shifter 100 shifts an activation timing of reset signal /RST and activates reset signal /RST after delayed restore period signal /RSTRD rises to H level to reset set/reset flip-flop 128.

Internal normal row activation signal /intRE from set/reset flip-flop 128 is deactivated to rise to H level in response to activation of reset signal /RST. In response, an output signal of composite AND gate 170 rises to H level. When address transition detection signal ATD falls to cause set fast signal /SETF to enter active state, shifter 127 activates set signal /SET. Internal normal row activation signal /intRE is responsively activated, and a data read operation (in a case where data access is data reading) is performed in accordance with the next address AD1.

The operation made when address transition detection signal ATD is activated is the same as that shown in the timing chart shown in FIG. 2. Specifically, the set signal /SET is activated after a refreshing operation is completed and refresh activation signal /REFE is deactivated.

Therefore, in the configuration shown in FIG. 19, even if address transition detection signal ATD is generated before a recovery operations (internal initialization operation) is internally completed, the next internal operation is started after the recovery operation is internally completed and the internal state restores to the initial state.

Address transition detection signal ATD is generated on the basis of a change in all the address signal bits. Address signal bits naturally include a skew, and therefore it is considered that the address transition detection signal ATD is consecutively activated in a short cycle due to a skew in the address bits.

Consideration is now given of a state where after address signal AD0 changes, address signal AD1 is applied and then, address AD1 changes to address AD2 in a short period. An effective period of address signal AD1 is shorter than a period for which a restore operation is internally performed. In this case as well, by using composite AND gate 170, a series of operations can be performed in which after a restore operation and a recovery operation is internally completed, internal normal row activation /intRE is again activated in accordance with address transition detection signal ATD to perform a data read operation (in a case where a read command is applied) in accordance with the next address signal AD2.

Even in a case where there arises a comparatively large address skew that an address changes at an interval a little longer than a pulse width of address transition detection signal ATD by a skew or the like, the next operation can be started reliably without destruct of data after an internal operation is completed and the internal state restores to the initial state. With such a configuration, an address-skew-free semiconductor memory device can be achieved.

Fifth Embodiment

Figure 22:
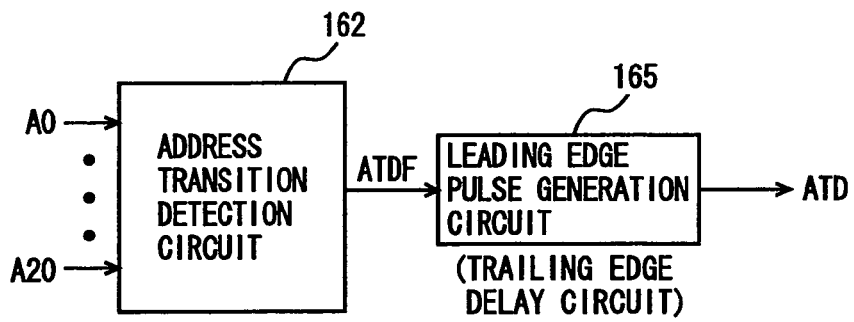
FIG. 22 is a diagram schematically showing a configuration of a main part of a semiconductor memory device according to a fifth embodiment of the present invention.

FIG. 22 is a diagram schematically showing a configuration of a main part of the semiconductor memory device according to a fifth embodiment of the present invention. In FIG. 22, there is shown schematically the configuration of a part generating address transition detection signal ATD. In FIG. 22, there is provided a leading edge pulse generation circuit 165 generating a one-shot pulse signal in response to a rising of output signal ATDF of address transition detection circuit 162. An output signal of leading edge pulse generation circuit 165 is used as address transition detection signal ATD. An activation time width of address transition detection signal ATD is substantially on the same order of a restore period, that is, an activation period of restore period signal /RSTR.

Figure 23:
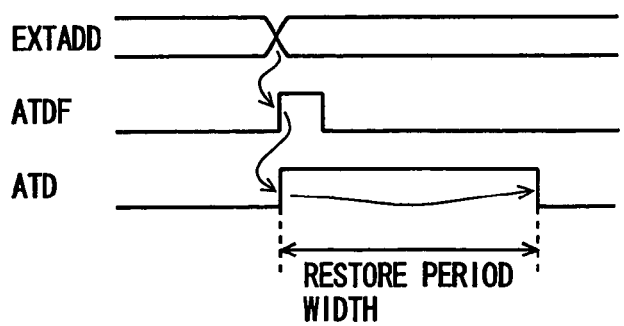
FIG. 23 is a signal waveform chart representing an operation of the circuitry shown in FIG. 22.

FIG. 23 is a timing chart representing an operation of address transition detection signal generating section shown in FIG. 22. In a case where address signal EXTADD changes as shown in FIG. 23, address transition detection circuit 162 generates address transition detection fast signal ATDF having a prescribed time width. Leading edge pulse generation circuit 165 outputs a pulse signal having a prescribed time width as address transition detection signal ATD in response to a rising of address transition detection fast signal ATDF. Leading edge pulse generation circuit 165 may be, for example, of a rising pulse generation circuit generating a one-shot pulse signal in response to rising of address transition detection fast signal ATDF. Furthermore, leading edge pulse generation circuit 165 may also be a trailing edge delay circuit delaying a trailing edge of address transition detection fast signal ATDF.

Figure 24:
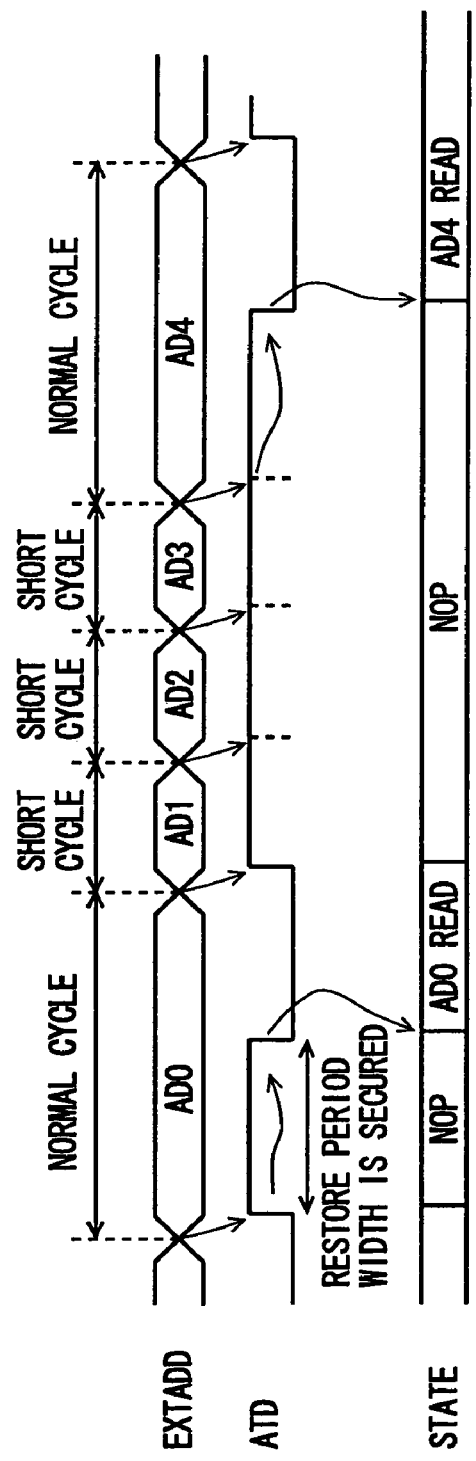
FIG. 24 is a timing chart representing an operation of the semiconductor memory device according to the fifth embodiment of the present invention.

FIG. 24 is a diagram schematically showing an operation sequence in a case where address short cycles continue. A case is considered in which as shown in FIG. 24, after external address signal AD0 is applied, address signals AD1, AD2 and AD3 are consecutively applied at intervals shorter than a restore period. In this case, address transition detection signal ATD is generated in response to transitions of address signals AD1, AD2 and AD3. Address transition detection signal ATD rises to H level after address signal A1 is applied, and address transition detection signal ATD falls to L level upon elapse of the time width of address transition detection signal ATD when address signal A4 is applied, and data reading operation to the address A4 (when data read instruction is applied) is performed.

Therefore, in a case where address signals AD1, AD2 and AD3 are applied in a short cycle and address transition detection signals ATD are activated, there is no need to ensure the time periods for performing a restore operation and a recovery operation for each of address signals AD1 to AD3, and access to address signal AD4 is started when a normal time width of address transition detection signal ATD elapses. Therefore a short cycle of address is neglected without exerting an adverse influence on normal data access, no unnecessary internal operation needs to perform and destruction of data can be prevented.

According to the fifth embodiment of the present invention, as described above, an activation period width of address transition detection signal ATD is made equal to or longer than a restore time width. Thus, even if a short cycle shorter than a restore period is consecutively occurs, a high speed access can be made without exerting any adverse influence on a normal data access.

Sixth Embodiment

Figure 25:
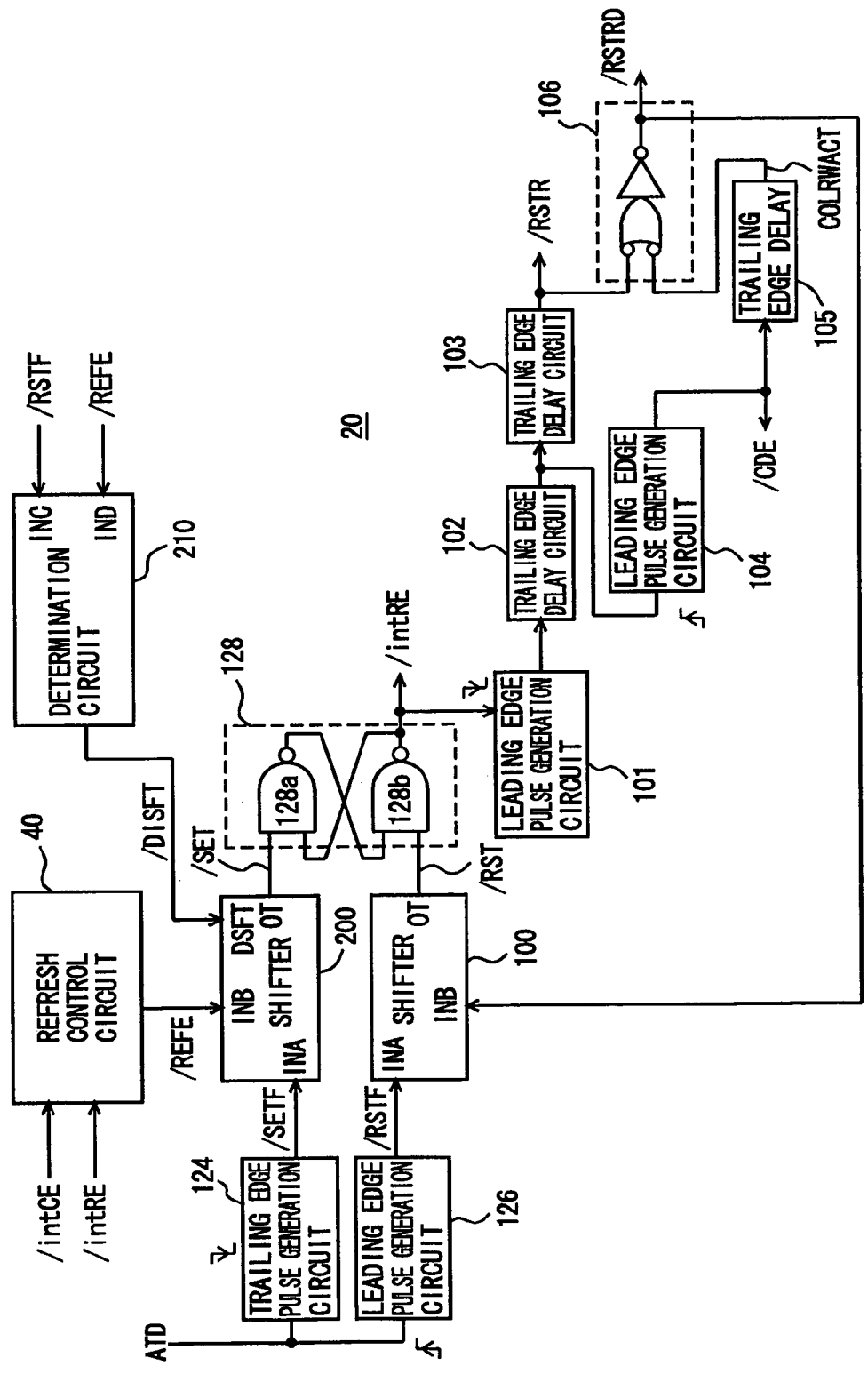
FIG. 25 is a diagram schematically showing a configuration of a main part of a semiconductor memory device according to a sixth embodiment of the present invention.

FIG. 25 is a diagram schematically showing a configuration of a main control circuit according to a sixth embodiment of the present invention. In main control circuit 20 shown in FIG. 25, there is provided a determination circuit 210 determining whether refresh activation signal /REFE is in active state when address transition detection signal ATD is activated and responsively a reset fast signal /RSTF is activated by leading edge pulse generation circuit 126. In accordance with the result of determination of determination circuit 210, shifting operation of shifter 200 is selectively prohibited on a setting timing of set/reset flip-flop 128 for controlling activation/deactivation of internal normal row activation signal /intRE.

Specifically, while refresh activation signal /REFE is in active state, address transition detection signal ATD rises to accordingly activate the reset signal /RSTF, a shifted access is not performed after completion of the refreshing operation.

The other configuration of main control circuit 20 shown in FIG. 25 is the same as the configuration of the main control circuit shown in FIG. 16, the same reference numerals are attached to corresponding components and detailed descriptions thereof will not be repeated.

Figure 26:
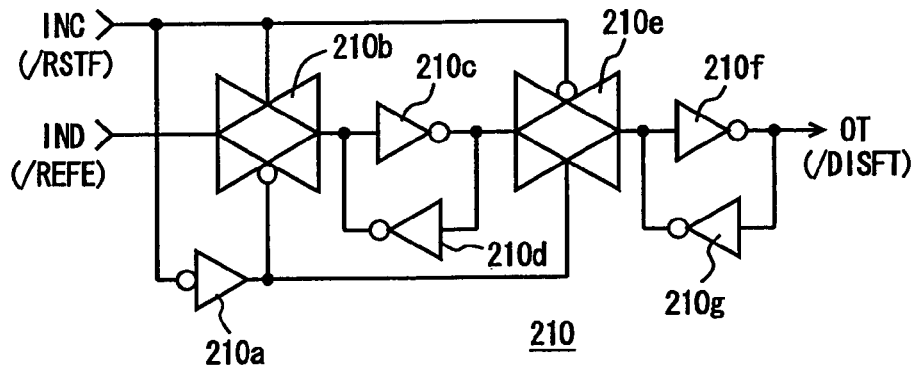
FIG. 26 is a diagram showing an example of the configuration of a determination circuit shown in FIG. 25.

FIG. 26 is a diagram showing an example of the configuration of determination circuit 210 shown in FIG. 25. In FIG. 26, determination circuit 210 includes: an inverter 210a inverting a signal (/RSTF) applied to input node INC; a CMOS transmission gate 210b rendered conductive in accordance with an output signal of inverter 210a and a signal (/RSTF) at input node INC, to pass a signal (/REFE) applied to node IND; an inverter 210c inverting a signal applied through CMOS transmission gate 210b; an inverter 210d inverting an output signal of inverter 210c to transmit the inverted signal to the input of inverter 210c; and a CMOS transmission gate 210e rendered conductive in response to a signal at input node INC and an output signal of inverter 210a to pass an output signal of inverter 210c.

CMOS transmission gates 210b and 210e are made conductive complementarily to each other. CMOS transmission gates 210b and 210e are rendered conductive when the signal (/RSTF) at input node INC is at H level and L level, respectively. Inverters 210c and 210d constitute a latch circuit.

Determination circuit 210 further includes: an inverter 210f inverting a signal applied through CMOS transmission gate 210e to output a signal (/DISFT) to output node OUT; and an inverter 210g inverting an output signal inverter 210f to transmit the inverted signal to input of inverter 210f. Inverters 210f and 210g constitute an inverter latch.

Figure 27:
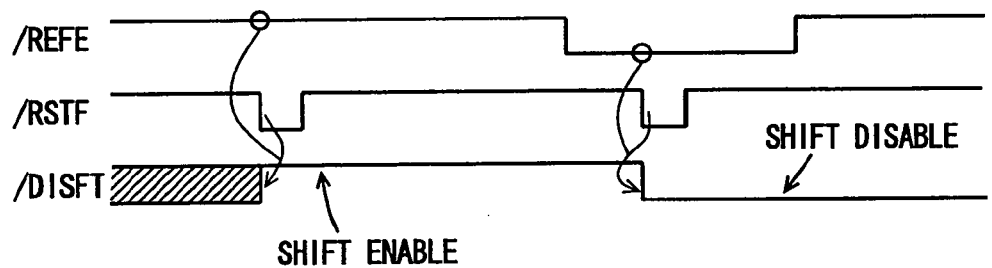
FIG. 27 is a timing chart representing an operation of the determination circuit shown in FIG. 26.

FIG. 27 is a timing chart representing an operation of determination circuit 210 shown in FIG. 26. Description will be below given of the operation in the determination circuit shown in FIG. 26 with reference to FIG. 27.

If the signal /REFE applied to input node IND is at H level when reset fast signal /RSTF applied to input node INC is at L level, CMOS transmission gate 210b enters non-conductive state and CMOS transmission gate 210e enters conductive state in response to a falling of reset fast signal /RSTF. In response, a determination result signal /DISFT from output node OT rises to H level.

On the other hand, if refresh activation signal /REFE is at L level when reset fast signal /RSTF falls to L level, determination result signal /DISFT falls to L level in response to falling of reset fast signal /RSTF.

When determination result signal/DISFT is at H level, a shifting operation becomes valid. On the other hand, when determination result signal /DISFT is at L level, a shifting operation becomes invalid to cancel a shifted access cycle in the next cycle. Thus, access (restore and recovery) based on an unnecessary short cycle is prohibited.

Figure 28:
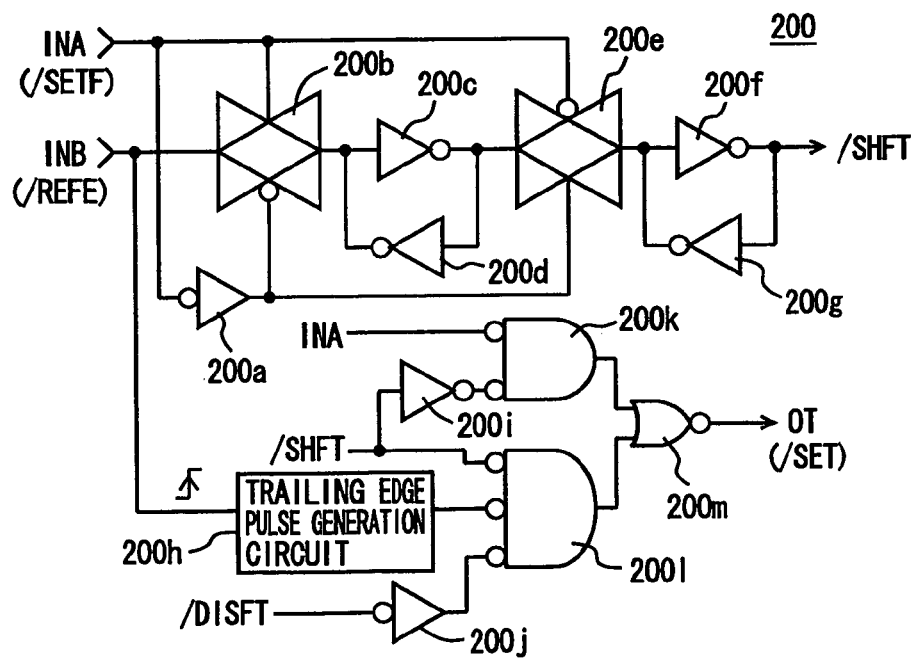
FIG. 28 is a diagram showing an example of the configuration of a shifter shown in FIG. 25.

FIG. 28 is a diagram showing an example of the configuration of shifter 200 shown in FIG. 25. In FIG. 28, shifter 200 includes an inverter 200a inverting a set fast signal (/SETF) applied to input INA; a CMOS transmission gate 200b selectively rendered conductive, in accordance with an output signal of inverter 200a and a signal (/SETF) at input node INA, to transmit a signal (/REFE) applied to input node INB; an inverter 200c inverting an signal passing through CMOS transmission gate 200b; an inverter 200d inverting an output of inverter 200c to transmit the inverted signal to input of inverter 200c; CMOS transmission gate 200e rendered conductive, in accordance with the signal applied to input node INA and an output signal of inverter 200a, to transmit an output signal of inverter 200c; and inverters 200f and 200g latching a signal received through CMOS transmission gate 200e.

CMOS transmission gates 200b and 200e are rendered conductive complementarily to each other and CMOS transmission gate 200b is rendered conductive when the signal (/SETF) at input node INA is at H level. Shift control signal /SHFT is outputted from inverter 200f.

Shifter 200 further includes: a trailing edge pulse generation circuit 200h generating a one-shot pulse signal in response to a trailing edge (a rising) of signal (/REFE) applied to input node INB; an inverter 200i inverting shift control signal /SHFT; an inverter 200j inverting determination signal /DISFT from determination circuit 210; a NOR gate 200k receiving an output signal of inverter 200i and the signal (/SETF) at input node INA; a NOR gate 200l receiving shift control signal /SHFT, an output signal of trailing edge pulse generation circuit 200h and an output of inverter 200a; and a NOR gate 200m receiving output signals of NOR gates 200k and 200l to output the set signal (/SET) to output node OT.

The configuration of shifter 200 shown in FIG. 28 is equivalent to a configuration of shifter 127 shown in FIG. 7 with 2-input NOR gate 127a replaced with 3-input NOR gate 200*l*, in order to selectively validate/invalidate an output signal of trailing edge pulse generation circuit 200*h* in accordance with determination result signal /DIDFT.

Figure 29:
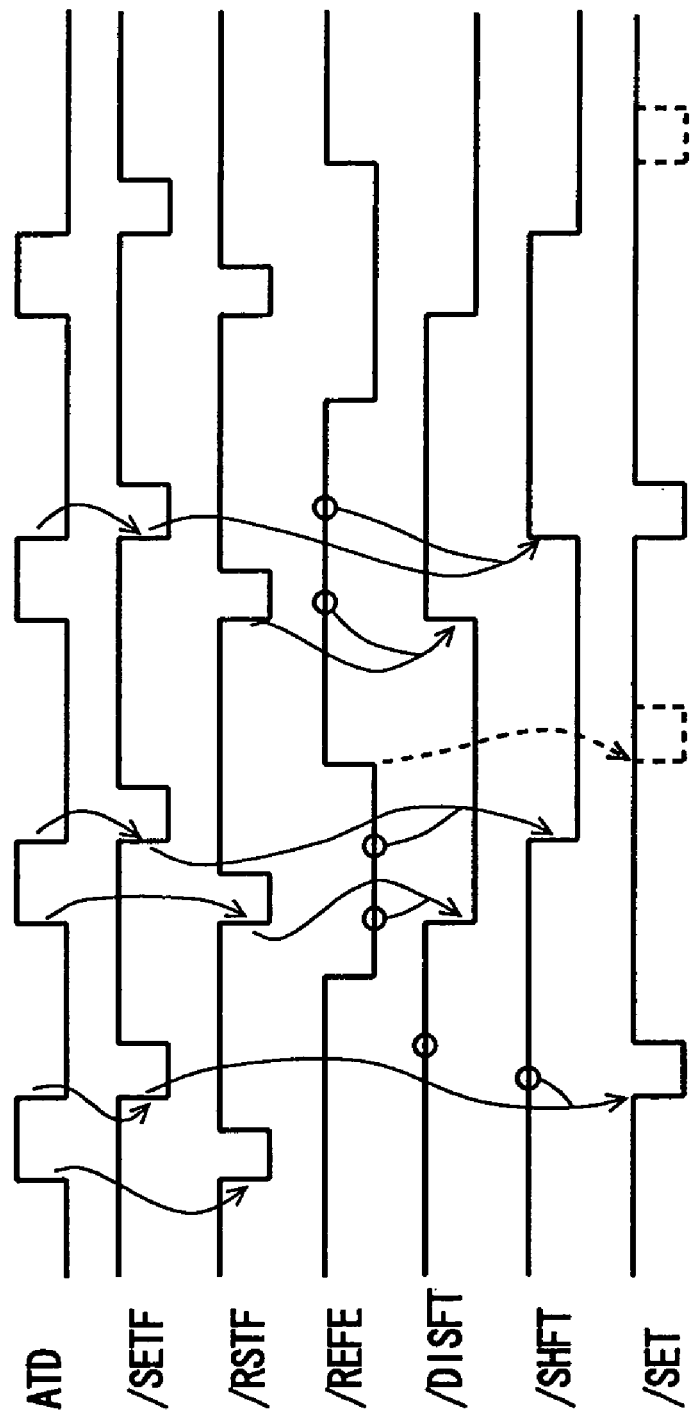
FIG. 29 is a timing chart representing an operation of the shifter shown in FIG. 28.

FIG. 29 is a timing chart representing an operation of shifter shown in FIG. 28. Description will be below given of the operations in shifter 200 shown in FIG. 28 with reference to FIG. 29.

When address transition detection signal ATD rises, reset fast signal /RSTF from leading edge pulse generation circuit 126 shown in FIG. 25 falls to L level responsively. At this time, it is assumed that refresh activation signal /REFT, determination result signal /DISFT and shift control signal /SHFT are all at H level. In this case, set fast signal /SETE falls to L level in response to falling of address transition detection signal ATD. Since shift control signal /SHFT is at H level, set signal /SET falls to L level in response to falling of set fast signal /SETF, to set the set/reset flip-flop 128 shown in FIG. 25.

Now, consideration is given on a state where when address transition detection signal ATD is activated, refresh activation signal /REFE is at L level. In this case, when reset fast signal /RSTF falls to L level in response to a rising of the address transition detection signal, determination result signal /DISFT falls to L level responsively since refresh activation signal /REFE is at L level.

When set fast signal /SETF falls to L level in response to a falling of address transition detection signal A/D, shift control signal /SHFT falls to L level since refresh activation signal /REFE is at L level. Trailing edge pulse generation circuit 200*h* shown in FIG. 28 generates a one-shot pulse signal in response to a rising (a trailing edge) of refresh activation signal /REFE. In this case, however, since determination result signal /DISFT is at L level, an output signal of inverter 200*j* is at H level and in response, an output signal of NOR gate 200*l* is at L level. Since shift control signal /SHFT is also at L level, an output signal of inverter 200*i* is at H level and an output signal of NOR gate 200*k* is also at L level. Therefore, even when refresh activation signal /REFE rises to H level, set signal /SET from output node OT maintains H level and an operating state of the next cycle is a NOP state.

When refresh activation signal /REFE rises to H level and address transition detection signal ATD is again generated, determination result signal /DISFT rises to H level in response to falling of reset fast signal /RSTF. Then, set fast signal /SETF falls to L level in response to a falling of address transition detection signal ATD and in response, shift control signal /SHFT rises to H level since refresh activation signal /REFE is at H level. In this case, therefore, set signal /SET is activated in response to falling of set fast signal /SETF to start a data access operation.

Figure 30:
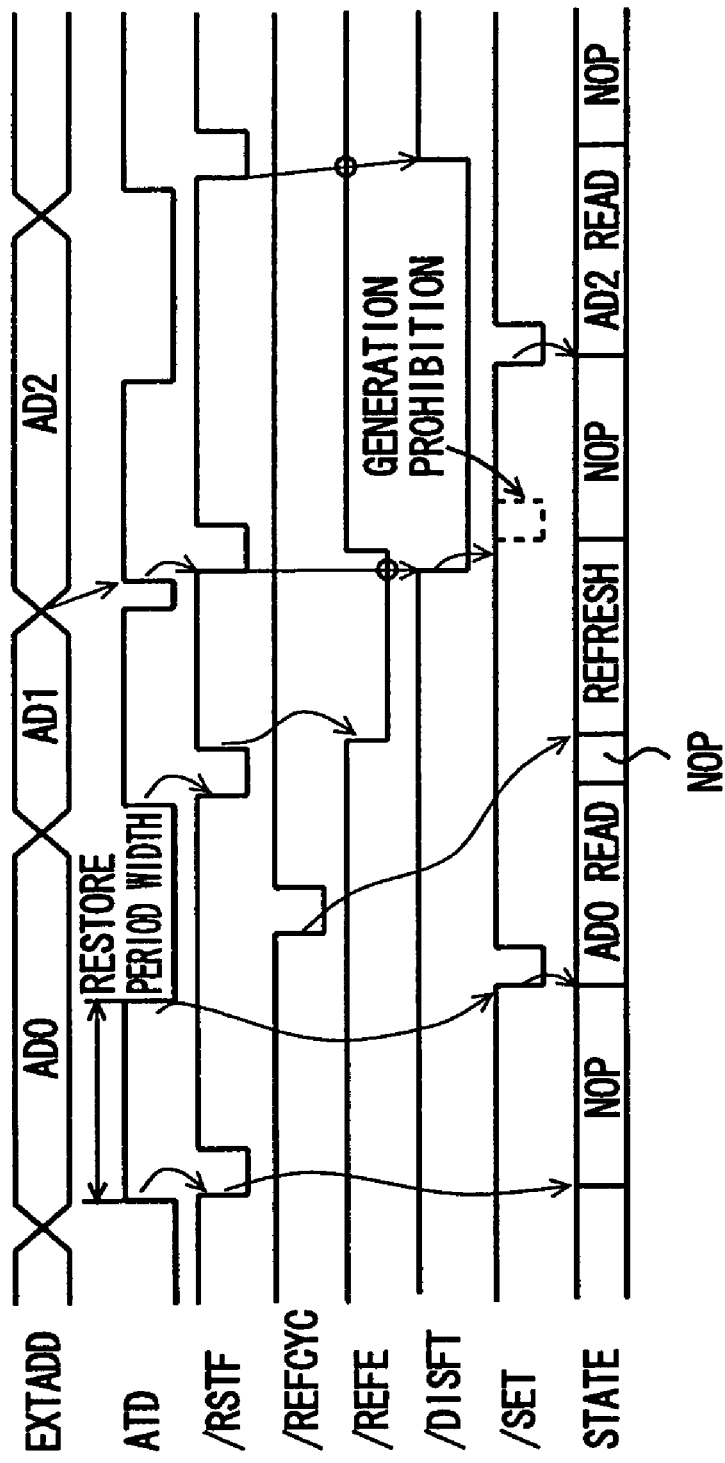
FIG. 30 is a timing chart representing an operation of the semiconductor memory device according to the sixth embodiment of the present invention.

FIG. 30 is a diagram showing a data access sequence in a case where the main control circuit shown in FIG. 25 is used schematically. Description will be below given of operations in data reading in a case where the main control circuit shown in FIG. 25 is used with reference to FIG. 30.

When address signal AD0 is applied, address transition detection signal ATD is generated to activate reset fast signal /RSTF. In this case, if refresh activation signal /REFE is at H level and determination result signal /DISFT is at H level, an internal state is NOP state maintaining a precharged state during a period when address transition detection signal ATD is at H level.

When address transition detection signal ATD falls to L level, set signal /SET is activated in accordance with set fast signal /SETF and in response, internal normal row activation signal /intRE is activated and to allow execution of a data access operation (read operation) in accordance with address signal AD0. Consideration is given on a state in which refresh cycle signal /REFCYC is issued during a data access operation for address signal AD0. In this case, a refresh flag not shown is maintained in active state in accordance with issuance of refresh cycle signal /REFCYC.

When address signal AD1 is applied following address AD0, address transition detection signal ATD rises, an instruction is applied on completion of a data access cycle for address signal AD0 and in response reset fast signal /RSTF falls to L level. In this case, since refresh activation signal /REFE is at H level, reset signal /RST is activated in accordance with reset fast signal /RSTF and internal normal row activation signal /intRE is deactivated. Therefore, an internal state becomes NOP state after reset fast signal /RSTF falls to L level.

When reset fast signal /RSTF rises to H level, refresh activation signal /REFE is activated in accordance with a refresh flag (not shown), and a refreshing operation is performed.

When address signal changes from AD1 to AD2 during an activation period of refresh activation signal /REFE, address transition detection signal ATD once falls and then rises to H level again. That is, in a case where address transition detection signal ATD has a pulse width of a restore period width and address signal AD1 has a cycle time longer than the restore period, address transition detection signal ATD is generated in accordance with address signal AD2. In this case, reset fast signal /RSTF falls to L level in response to rising of address transition detection signal ATD. At this time, determination result signal /DISFT falls to L level, since refresh activation signal /REFE is at L level, to invalidate the shifting of shifter 200. Accordingly, even when refresh activation signal /REFE rises to H level, set signal /SET is at H level and an internal state is maintained to NOP state. Subsequently, when address transition detection signal ATD falls to L level, set signal /SET falls to L level in response to falling of address transition detection signal ATD to allow execution of data access for address AD2.

When the data access cycle for address signal AD2 is completed, determination result signal /DISFT rises to H level in response to a rising of address transition detection signal ATD.

A refreshing operation is activated after completion of the data access cycle for address signal AD0. Completion of the data access cycle for address signal AD0 is triggered by a transition of address signal AD1. When address transition detection signal ATD rises again during a period of refresh activation, a cycle time of address signal AD1 is of the same order of or a little longer than a refresh cycle time, that is, a restore period, but is a cycle shorter than a normal cycle including a restore period, a column access period and a recovery period. Therefore, a restore operation is not performed for the short cycle of address signal AD1 even after completion of refreshing. Therefore, a delay by the restore period for address AD1 can be prevented from delaying the access for address signal AD2, thereby achieving high speed access.

In the above description, a cycle of address signal AD1 is regarded as one meaningful cycle. However, in a case where consecutive short cycles are applied as shown in FIG. 24 due to address skew or the like in a period of application of address signal AD1 as well, a period in which address transition detection signal is at H level is increased correspondingly. Similarly, restore operations for the respective short cycle addresses upon completion of the consecutive short cycles are ceased and the data access operation for address signal AD2 is started in response to a falling of address transition detection signal ATD as described previously.

According to the sixth embodiment of the present invention, as described above, when the address detection signal rises in a period in which a refresh activation signal is in active state, a shifting of a restore operation to the next cycle is prohibited and an access for an address signal in a normal cycle can be executed, thereby enabling a high speed access without an adverse influence of address skew.

Seventh Embodiment

Figure 31:
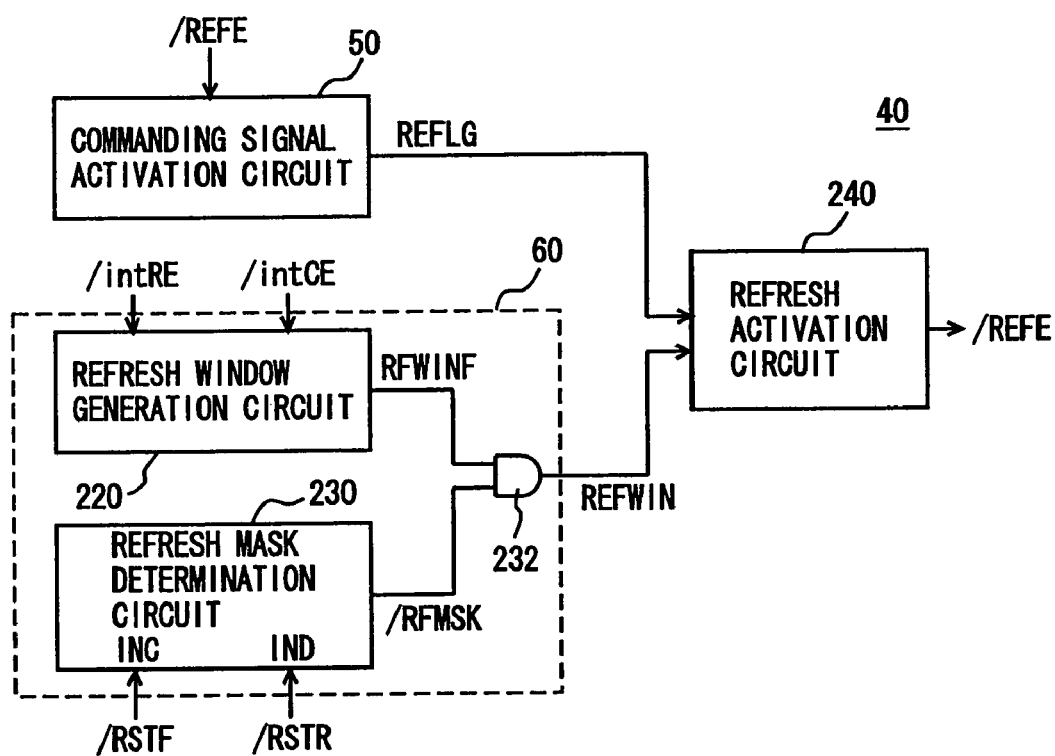
FIG. 31 is a diagram schematically showing a configuration of a main part of a semiconductor memory device according to a seventh embodiment of the present invention.

FIG. 31 is a diagram schematically showing a configuration of a refresh control circuit according to a seventh embodiment of the present invention. The configuration of the refresh control circuit shown in FIG. 31 corresponds to the refresh control circuit shown in FIG. 2. In FIG. 31, refresh control circuit 40, similarly to the configuration shown in FIG. 2, includes: a commanding signal activation circuit 50 activating refresh flag REFLG in accordance with a refresh cycle signal from an internal refresh timer; a determination circuit 60 generating refresh window signal REFWIN providing a timing of determining whether or not refresh should be executed upon completion of data access; and a refresh activation circuit 240 generating refresh activation signal /REFE in accordance with refresh flag REFLG and refresh window signal REFWIN.

Commanding signal activation circuit 50 deactivates refresh flag REFLG in response to a trailing edge (a rising) of refresh activation signal /REFE. Refresh activation circuit 240 activates refresh activation signal /REFE when refresh flag REFLG is at H level while refresh window signal REFWIN is at H level. The configurations of commanding signal activation circuit 50 and refresh activation circuit 240 are the same as those shown in FIGS. 4 and 2.

Determination circuit 60 includes: a refresh window generation circuit 220 generating refresh window fast signal RFWINF in accordance with internal normal row activation signal /intRE and internal chip enable signal /intCE; a refresh mask determination circuit 230 generating refresh mask signal RFMSK in accordance with reset fast signal /RSTF and restore time signal /RSTR; and an AND gate 232 generating refresh window signal REFWIN in accordance with window signal RFWIN and refresh mask signal RFMSK.

Refresh window generation circuit 220 has a configuration similar to the configuration shown in FIG. 5, and generates refresh window fast signal RFWINF in response to activation of internal normal row activation signal /intRE when internal chip enable signal /intCE is at L level, and sets refresh window fast signal RFWINF to H level while internal chip enable signal /intCE is at H level.

Refresh mask determination circuit 230 has a configuration similar to the configuration of determination circuit 210 shown in FIG. 26, sets refresh mask signal RFMSK to H level if restore period signal /RSTR is at H level when reset fast signal /RSTF applied to input INC rises to H level, and sets refresh mask signal RFMSK to L level if restore period signal /RSTR is at L level when reset fast signal /RSF falls from H level to L level. Even if refresh window fast signal RFWINF is issued, no refresh window signal REFWIN is issued when refresh mask signal RFMSK is at L level.

Figure 32:
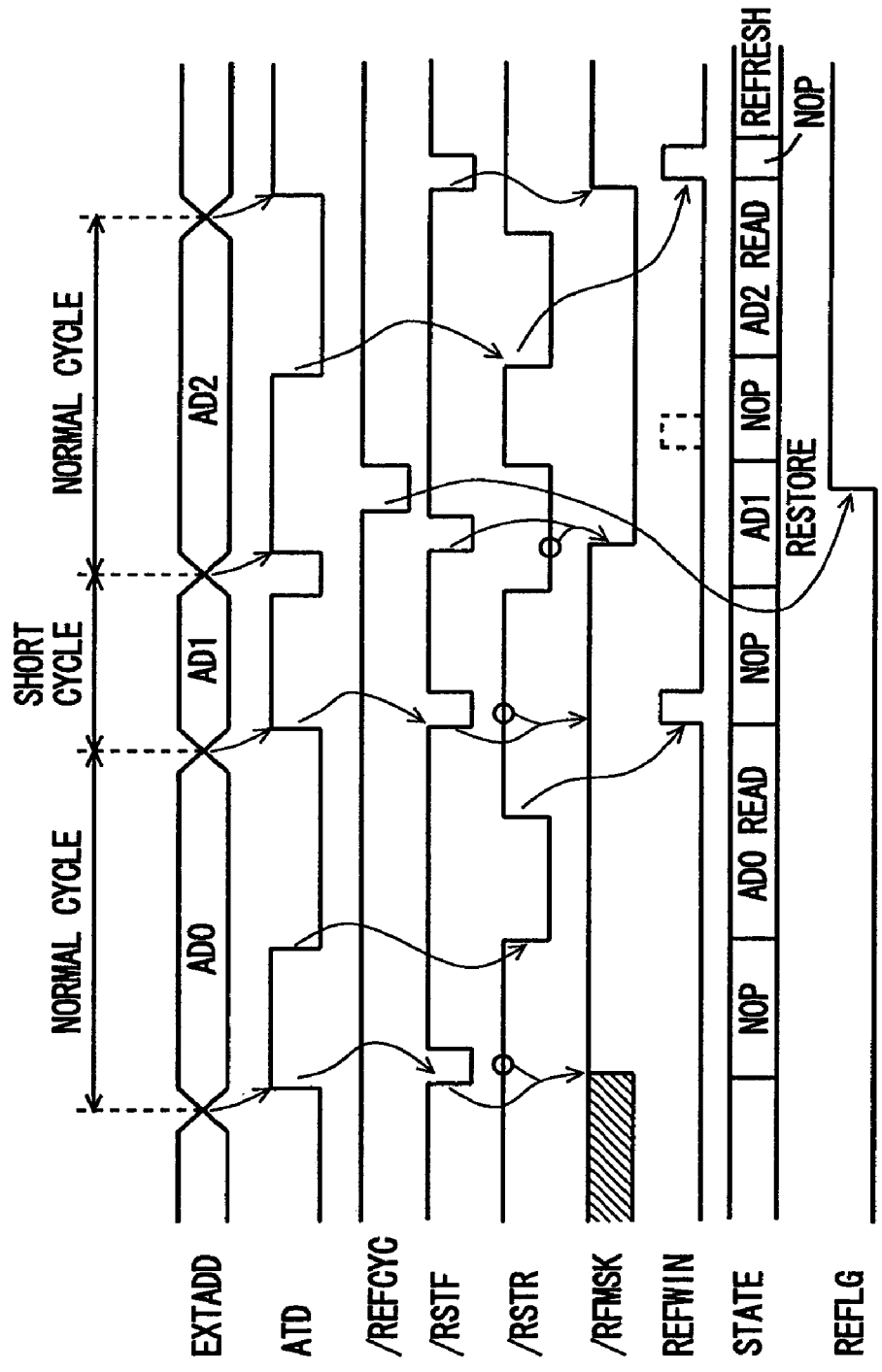
FIG. 32 is a timing chart representing an operation of the circuitry shown in FIG. 31.

FIG. 32 is a diagram representing an operation in refresh control circuit 40 shown in FIG. 31 and an internal state of a semiconductor memory device. Description will be below given of operations in refresh control circuit 40 shown in FIG. 31 with reference to FIG. 32.

When address signal AD0 is applied, address transition detection signal ATD rises and in response, reset fast signal RSTF falls to L level. If restore period signal /RSTR is at H level when reset fast signal /RSTF is at L level, refresh mask signal RFMSK from refresh mask determination circuit 280 is set to H level. When a column recovery period is completed as depicted in the signal waveform diagram shown in FIG. 17, internal normal row activation signal /intRE is deactivated.

An activation period width of address transition detection signal ATD is equal to or longer than a restore period width. When address transition detection signal ATD falls to L level, internal normal row activation signal /intRE is activated and in response, restore period signal /RSTR is activated. When a prescribed period elapses, restore period signal /RSTR rises to H level and when the recovery period further elapses thereafter, internal normal row activation signal /intRE is deactivated. In response to deactivation of internal normal row activation signal /intRE, refresh window generation circuit 220 generates window signal RFWINF. Since refresh mask signal RFMSK is at H level, refresh window signal REFWIN is generated in accordance with refresh window fast signal RFWINF. Since refresh flag REFLG is not set, no refreshing is executed.

When address signal AD1 is applied, address transition detection signal ATD rises to H level. In response to the rising of address transition detection signal ATD, reset fast signal /RSTF falls to L level and restore period signal /RSTR is again incorporated and outputted. In this case as well, since restore period signal /RSTR is at H level, refresh mask signal. /RFMSK maintains the H level. When address transition detection signal ATD falls to L level in accordance with address signal AD1, restore period signal /RSTR falls to L level, and a memory cell select operation starts. It is considered that the next address signal AD2 is applied while restore period signal /RSTR is in active state. In this case, a cycle of address signal AD1 is a short cycle having a time width longer than a restore period. In this case, in response to a rising of address transition detection signal ATD, reset fast signal /RSTF falls to L level and in response, refresh mask signal /RFMSK falls to L level since restore period signal /RSTR is at L level. At this time, if refresh cycle signal /REFCYC is issued, refresh flag REFLG is set.

When a restore operation (and a recovery operation) for address AD1 is completed, a restore period signal /RSTR rises to H level and furthermore, internal normal row activation signal /intRE rises to H level. When internal normal row activation signal /intRE rises to H level, refresh window fast signal RFWINF is again generated from refresh window generation circuit 220. In this case, however, refresh mask signal /RFMSK is at L level, window signal RFWINF is masked and refresh window signal REFWIN maintains the L level. Therefore, refresh activation signal /REFE maintains the inactive state and no refreshing is executed. Subsequently, in response to a falling of address transition detection signal ATD, a data access operation (read operation) for address signal AD2 is performed.

When a data access operation for address signal AD2 is completed, reset fast signal /RSTF falls to L level and refresh mask signal /RFMSK rises to H level. When a data access for address signal AD2 is completed, internal normal row activation signal /intRE rises to H level after completion of a recovery operation and in response, refresh window fast signal RFWINF is generated. Since refresh mask signal /RFMSK from refresh mask determination circuit 230 is at H level, refresh window signal REFWIN is generated in accordance with the window signal RFWINF. Since refresh flag REFLG is at H level, a refreshing operation is therefore executed after completion of a data access operation for address signal AD2.

By using refresh mask signal /RFMSK, therefore, in a normal cycle next to a short cycle longer than a restore period in which address transition detection signal changes, data access is executed, and no refreshing is performed. Thus, in the next normal cycle, a data access operation can be started in response to a falling of address transition detection signal ATD and deterioration of an access cycle can be prevented to achieve high speed access.

According to the seventh embodiment of the present invention, as described above, in a case where a short cycle longer than a restore period is detected, no refreshing is executed after completion of restoration (and recovery), but the next data access is performed in accordance with an address signal. Thus, deterioration of data access in a normal cycle can be suppressed.

Eighth Embodiment

Figure 33:
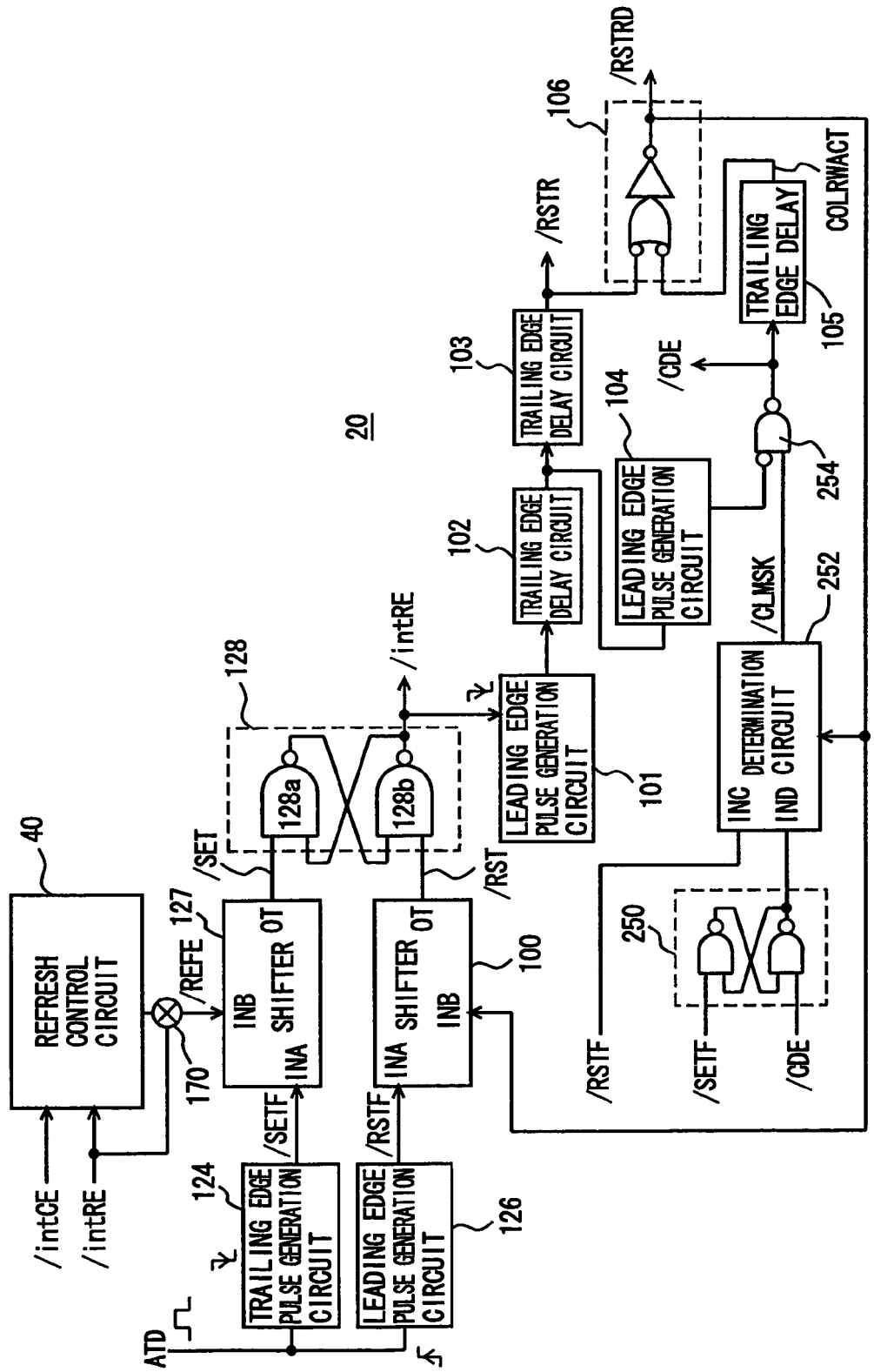
FIG. 33 is a diagram schematically showing a configuration of a main part of a semiconductor memory device according to an eighth embodiment of the present invention.

FIG. 33 is a diagram schematically showing a configuration of main control circuit 20 according to an eighth embodiment of the present invention. In FIG. 33, an output of a gate circuit 170 receiving refresh activation signal /REFE and internal normal row activation signal /intRE is applied to input node INB of shifter 127 that applies an output thereof to flip-flop 128 generating internal normal row activating signal /intRE.

Main control circuit 20 includes: a set/reset flip-flop 250 set in response to set fast signal /SETF from trailing edge pulse generation circuit 124, and reset in response to column activation signal /CDE; a determination circuit 252 determining a logical level of an output signal of set/reset flip-flop 150 in accordance with reset fast signal /RSTF from leading edge pulse generation circuit 126 to generate column mask signal /CLMSK; a gate circuit 254 receiving an output signal of leading edge pulse generation circuit 104 and column mask signal /CLMSK to generate column activation signal /CDE; and a trailing edge delay circuit 105 delaying a trailing edge of column activation signal /CDE from gate circuit 254 to generate column recovery period signal /COLRWACT. The other configuration of main control circuit 20 shown in FIG. 33 is the same as the configuration of the main control circuit shown in FIG. 19, the same reference numerals are attached to corresponding components and detailed descriptions thereof will not be repeated.

Determination circuit 252, having a configuration similar to that of the determination circuit shown in FIG. 26, generates column mask signal CLMSK in accordance with a logical level an output signal of set/reset flip-flop 250 upon a falling of reset fast signal/RSTF. In determination circuit 252, column mask signal/CLMSK is reset to H level in response to a rising of restore period signal /RSTRD. A reset function of determination circuit 252 is implemented simply by providing a reset transistor, rendered conductive in response to a rising of delayed restore period signal/RSTRD to transmit ground voltage to input of inverter 210f shown in FIG. 26, to input of inverter 210f.

Figure 34:
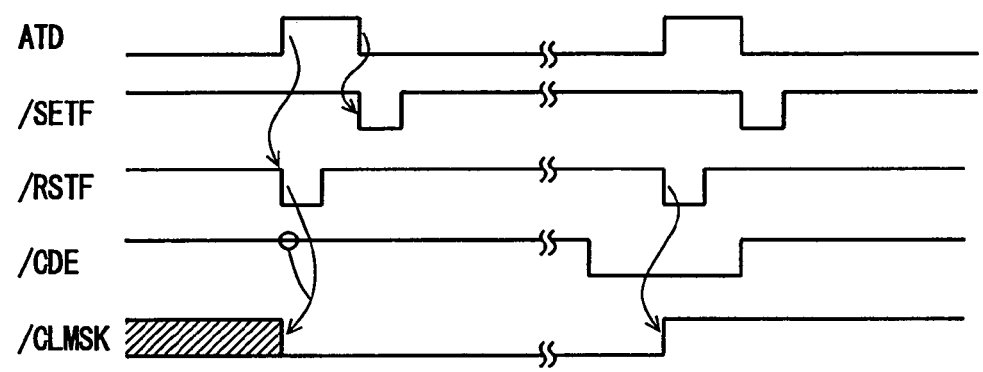
FIG. 34 is a timing chart representing an operation of the determination circuit shown in FIG. 33.

FIG. 34 is a signal waveform diagram representing an operation of set/reset flip-flop 250 and determination circuit 252 shown in FIG. 33. Brief description will be below given of operations of set/reset flip-flop 250 and determination circuit 252 with reference to FIG. 34.

When address transition detection signal ATD rises, reset fast signal /RSTF from leading edge pulse generation circuit 126 falls to L level. At this time, while column activation signal /CDE is inactive, column mask signal /CLMSK from determination circuit 252 maintains the L level and in response, column activation signal /CDE maintains the H level since set/reset flip-flop 250 maintains the set state. Therefore, when restore period signal /RSTR is deactivated, delayed restore period signal /RSTRD is deactivated to complete a restore operation. Determination circuit 252 is reset by deactivation of delayed restore period signal /RSTRD and column mask signal /CLMSK outputted therefrom is reset to H level.

When address detection signal ATD falls to L level, set fast signal /SETF from trailing edge pulse generation circuit 124 falls to L level and in response, set/reset flip-flop 250 is set. On the other hand, if column activation signal /CDE already in active state when address transition detection signal ATD is generated and reset fast signal RSTF falls to L level, set/reset flip-flop 250 is in reset state and an output thereof is at H level. Therefore, when reset fast signal /RSTF falls to L level, determination circuit 252 maintains column mask signal /CLMSK at H level in accordance with a signal at H level from set/reset flip-flop 250. In this case, column activation signal /CDE is generated according an output signal of leading edge pulse generation circuit 104.

By setting set/reset flip-flop 250 in accordance with set fast signal /SETF, it can be identified whether an address transition occurs in a current cycle before or after activation of column activation signal /CDE.

In a case where an address transition occurs before activation of column activation signal /CDE, column activation signal /CDE is maintained in inactive state. Accordingly, when restore period signal /RSTR rises to H level, delayed restore period signal /RSTRD rises to H level and reset signal /RST is generated by shifter 100, to deactivate internal normal row activation signal /intRE. Thus, in this case, the cycle for the next signal can be started without performing a column selection or a column recovery.

Figure 35:
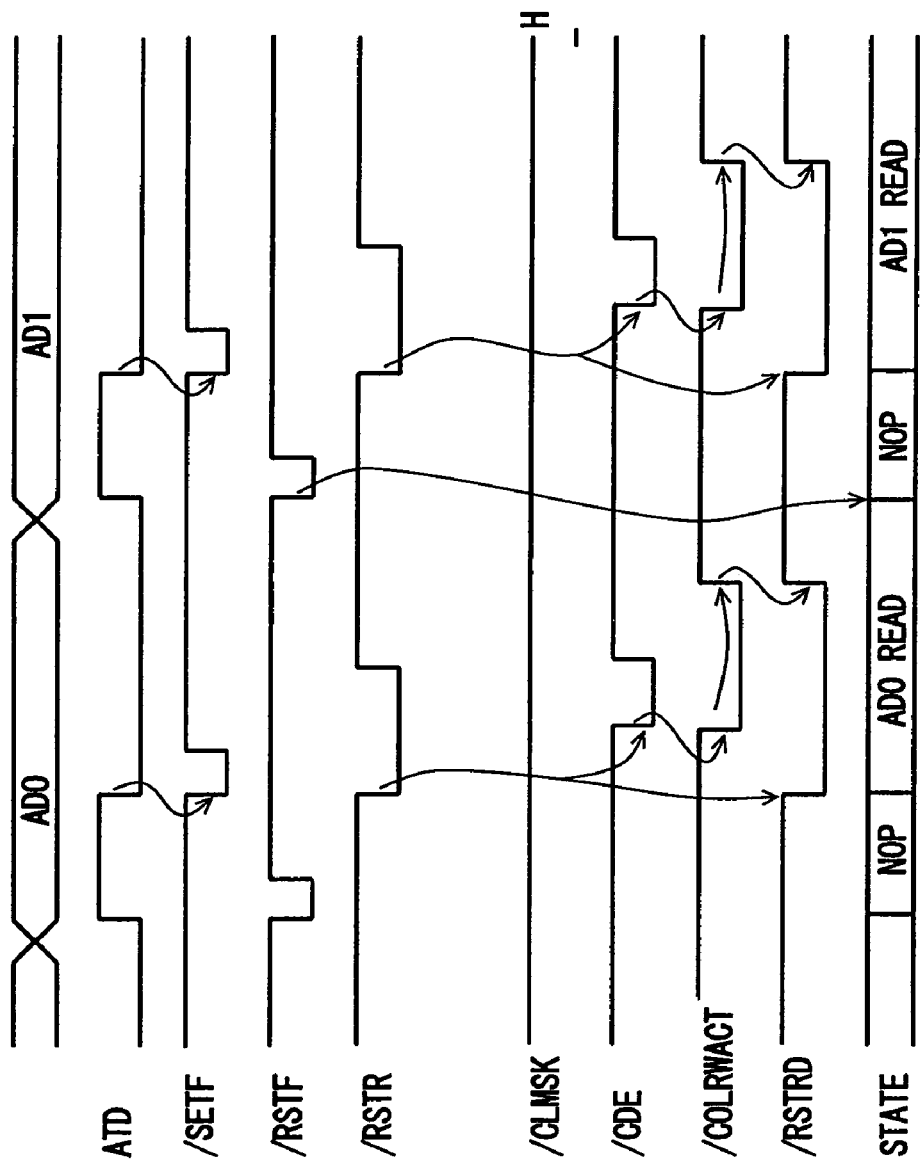
FIG. 35 is a timing chart representing an operation of the circuitry shown in FIG. 34.

FIG. 35 is a diagram representing an operation of the main control circuit shown in FIG. 33 and a state of the semiconductor memory device. Description will be below given of the operation when an address signal is correctly applied in a normal cycle with reference to FIG. 35.

When address AD0 is applied, address transition detection signal ATD rises first and in response, reset fast signal /RSTF from leading edge pulse generation circuit 126 falls to L level. At this time, even if column activation signal /CDE is restored to H level, set/reset flip-flop 250 is in reset state and outputs a signal at H level. Therefore, column mask signal /CLMSK from determination circuit 252 maintains the H level.

When address transition detection signal ATD falls to L level, set fast signal /SETF from trailing edge pulse generation circuit 124 falls, set/reset flip-flop 250 is set and an output signal thereof falls to L level. A data read operation for address signal AD0 is performed in accordance with a falling of address transition detection signal ATD. A one-shot pule is outputted from leading edge pulse generation circuit 104 when a prescribed time elapses after restore period signal /RSTR falls to L level. Since column mask signal /CLMSK is at H level, column activation signal /CDE is kept at L level for a prescribed period in accordance with output signal of leading edge pulse generation circuit 104. Thereby, a column select operation is performed and data reading from a selected memory cell is performed.

Column recovery period signal /COLRWACT falls to L level in response to a falling of column activation signal /CDE. If column recovery period signal /COLRWACT rises to H level when a prescribed period elapses, delayed restore period signal /RSTRD rises to H level, to complete a data access operation for address AD0. Column mask signal /CLMSK outputted by determination circuit 252 is set to H level (maintains the H level) in response to a rising of delayed restore period signal /RSTRD.

Therefore, when an address signal is applied in a normal cycle, column mask signal /CLMSK maintains the H level, and selection operations on a row and a column of memory cells are performed.

Subsequently, when address signal AD1 is applied, reset fast signal RSTF falls to L level. In this case, column activation /CDE has been activated and set/reset flip-flop 250 has been reset, and thus column mask signal /CLMSK maintains the H level.

Figure 36:
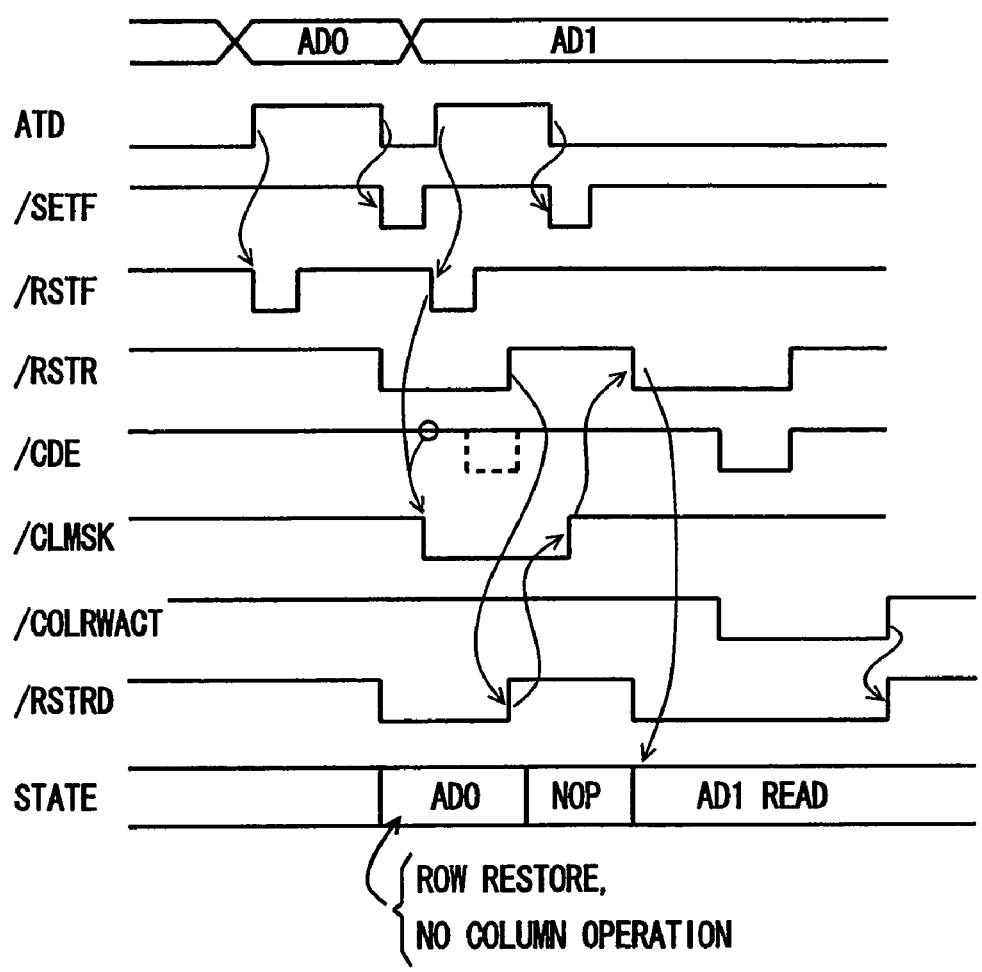
FIG. 36 is a timing chart representing an operation in a short cycle of the semiconductor memory device shown in FIG. 33.

Now, description will be given of an operation in a case where an address signal is applied in a short cycle with reference to FIG. 36.

When address signal AD0 is applied, address transition detection signal ATD rises to H level and in response reset fast signal /RSTF falls to L level. Determination circuit 252 takes in an output signal of set/reset flip-flop 250 in response to a falling of reset fast signal /RSTF to generate column mask signal /CLMSK. In FIG. 36, there is shown a case where column mask signal /CLMSK is set at H level as one example.

Subsequently, when address transition detection signal ATD falls to L level, set fast signal /SETF is set to L level, set/reset flip-flop 250 is set and an output signal thereof falls to L level. When address transition detection signal ATD is activated and internal normal row activation signal /intRE in the previous cycle is deactivated, set signal /SET is activated to activate restore period signal /RSTR and a row selection and sense and restore operations are executed on memory cells.

When the next address signal AD1 is applied in a restore operation, reset fast signal /RSTF falls to L level. At this time, since column activation signal /CDE is still in inactive state, determination circuit 252 sets column mask signal /CLMSK to L level in accordance with the signal at L level outputted by set/reset flip-flop 250. Accordingly, gate circuit 254 outputs a signal at H level to maintain column activation signal /CDR at the H level. In this situation, when a delay time at trailing edge delay circuit 103 elapses and restore period signal /RSTR rises to H level, delayed restore period signal /RSTRD from composite AND gate 106 also rises to H level to complete a cycle for address AD0. For address signal AD0, no column selection operation is accordingly performed, but only restore and recovery operations in row related circuits are performed. When restore period signal /RSTRD rises to H level, reset signal /RST from shifter 100 shown in FIG. 33 is activated and internal normal row activation signal /intRE is deactivated. Furthermore, determination circuit 252 is reset to set column mask signal /CLMSK to H level.

Then, address transition detection signal ATD falls to L level, set fast signal /SETF falls to L level and set/reset flip-flop 250 is again set.

Subsequently, when internal row activation signal /intRE for address signal AD1 is activated, restore period signal /RSTR falls to L level and a data access operation (read operation) for address signal AD1 is started. When a prescribed time elapses, a one-shot pulse signal is generated from leading edge pulse generation circuit 104. Since column mask signal /CLMSK is at H level of a reset state, column activation signal /CDE is activated to perform a column selection operation. Subsequently, when a delay time at trailing edge delay circuit 105 elapses, column recovery period signal /COLRWACT rises to H level, and in response, delayed restore period signal /RSTRD rises to H level to complete data access (data reading) for address AD1.

In a case of a short cycle for which an address signal transitions before column activation, by prohibiting a column selection operation, the next access is not required for waiting for completion of column selection and a column recovery period, but data access for the next address can be performed at a faster timing in accordance with internal normal row activation signal.

According to the eighth embodiment of the present invention, as described above, in a case where an address signal transitions in a restore period, a cycle for the address has been completed before the end of the restore period without performing the next column selection or column recovery. Transition from a short cycle to a normal cycle can be effected at a faster timing.

Other Embodiments

In the above description, an address signal is constituted of 20 bits, A0 to A20. However, the number of address bits is arbitrary, and has only to be determined appropriately in relation to a storage capacity of the memory. Furthermore, the number of bits of input/output data is not limited to 16 bits. Data input/output in a unit of 32 bits may be adopted.

According to the present invention, as described above, upon conflict between a refreshing operation and a data access operation, after one operation is completed, the other operation is executed, and therefore correct data access can be achieved without data destruction. Furthermore, a refreshing operation can be fully hidden from an outside, and thus, there can be implemented a fully hidden refresh DRAM having an interface compatible with an SRAM interface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a plurality of memory cells each requiring a refreshing of storage data and a restoration of read out data;
address transition detection circuitry for detecting a transition of an address signal applied externally to generate an address transition detection signal having a prescribed time width when detecting the transition in the address signal applied externally; and
internal control circuitry for initializing an internal operation in response to activation of said address transition detection signal and then activating a memory cell selection operation of performing an operation of selection of a memory cell in accordance with said address signal applied externally.

2. The semiconductor memory device according to claim 1, wherein
said plurality of memory cells are arranged in rows and columns, and
said internal control circuitry activates row and column selection operation in accordance with said address signal applied externally in a time division multiplexed manner in response to said address transition detection signal.

3. The semiconductor memory device according to claim 1, wherein
said internal control circuitry includes:
a circuit for generating an activation signal indicating that an internal circuit is in an active state; and
a circuit for avoiding a conflict between internal operations in accordance with said address transition detection signal and said activation signal.

4. The semiconductor memory device according to claim 1, wherein
said internal control circuitry, when consecutive address transitions occur within a prescribed time period, neglects a later address transition detection other than a first address detection signal in said consecutive address transitions.

5. The semiconductor memory device according to claim 1, wherein
said plurality of memory cells are dynamic type memory cells requiring a refreshing of storage data, and
said internal control circuitry, when said address transition detection signal is activated during activation of a refresh activation signal indicating an operation of the refreshing being under execution, delays a start of an internal operation according to said address transition detection signal till completion of the refreshing operation.

6. The semiconductor memory device according to claim 1, wherein
the memory cells are dynamic type memory cells having storage data destructively read out and requiring a restoration of the data read out, and are arranged in rows and columns, row and column selection operations on the memory cells are performed in a time division multiplexed manner, and an operation period of the restoration includes a period of an operation of the row selection, and said internal control circuitry, when said address transition detection signal is activated during the operation period of the restoration, ceases execution of a subsequent column selection operation and initializes a internal circuit to start a memory cell selection operation according to the address signal after completion of said restoration operation.

7. The semiconductor memory device according to claim 1, wherein
the memory cells are dynamic type memory cells having storage data destructively read and requiring a restoration of the data read out, and are arranged in rows and columns,
row and column selection operations are performed in a time division multiplexed manner, and
an operation period of the restoration includes a time period from the row selection till completion of the restoration of the data, and
said address transition detection circuitry generates the address transition detection signal having an activation period width at least equal to the operation period of the restoration in response to transition in said address signal, a leading edge of said address transition detection signal instructs a completion of an access of data and a trailing edge of said address transition detection signal instructs a start of an access of data.

* * * * *